(12) United States Patent
Sasagawa

(10) Patent No.: US 7,570,415 B2
(45) Date of Patent: Aug. 4, 2009

(54) MEMS DEVICE AND INTERCONNECTS FOR SAME

(75) Inventor: Teruo Sasagawa, Los Gatos, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 140 days.

(21) Appl. No.: 11/835,308

(22) Filed: Aug. 7, 2007

(65) Prior Publication Data
US 2009/0040590 A1 Feb. 12, 2009

(51) Int. Cl.
G02B 26/00 (2006.01)
G02F 1/03 (2006.01)

(52) U.S. Cl. ............... 359/290; 359/291; 359/295; 359/245; 427/123; 427/125

(58) Field of Classification Search ............ 359/290, 359/291, 295, 223, 224, 237, 238, 245, 585; 427/123, 125, 162, 250; 438/29, 48, 52, 438/202; 385/8, 14, 147; 216/13, 17, 24; 219/543; 345/108
See application file for complete search history.

(56) References Cited

U.S. PATENT DOCUMENTS

| | | | |
|---|---|---|---|
| 3,656,836 A | 4/1972 | de Cremoux et al. | |
| 4,377,324 A | 3/1983 | Durand et al. | |
| 4,403,248 A | 9/1983 | te Velde | |
| 4,459,182 A | 7/1984 | te Velde | |
| 4,482,213 A | 11/1984 | Piliavin et al. | |
| 4,859,060 A | 8/1989 | Kitagiri et al. | |
| 4,863,245 A | 9/1989 | Roxlo | |
| 4,965,562 A | 10/1990 | Verhulst | |
| 5,037,173 A | 8/1991 | Sampsell et al. | |
| 5,061,049 A | 10/1991 | Hornbeck | |
| 5,078,479 A | 1/1992 | Vuilleumier | |
| 5,079,544 A | 1/1992 | DeMond et al. | |
| 5,099,353 A | 3/1992 | Hornbeck | |

(Continued)

FOREIGN PATENT DOCUMENTS

CH 680534 9/1992

(Continued)

OTHER PUBLICATIONS

Butler et al., "An Embedded Overlay Concept for Microsystems Packaging," IEEE Transactions on Advanced Packaging IEEE USA, vol. 23, No. 4, pp. 617-622, XP002379648 (2000).

(Continued)

*Primary Examiner*—Loha Ben
(74) *Attorney, Agent, or Firm*—Knobbe, Martens, Olson & Bear, LLP

(57) ABSTRACT

A microelectromechanical systems device having an electrical interconnect between circuitry outside the device and at least one of an electrode and a movable layer within the device. A layer of the electrical interconnect is formed directly under, over, or between a partially reflective layer and a transparent layer of the device. The layer of the electrical interconnect preferably comprises nickel.

38 Claims, 16 Drawing Sheets

U.S. PATENT DOCUMENTS

| | | |
|---|---|---|
| 5,142,405 A | 8/1992 | Hornbeck |
| 5,214,419 A | 5/1993 | DeMond et al. |
| 5,214,420 A | 5/1993 | Thompson et al. |
| 5,218,472 A | 6/1993 | Jozefowicz et al. |
| 5,226,099 A | 7/1993 | Mignardi et al. |
| 5,272,473 A | 12/1993 | Thompson et al. |
| 5,293,272 A | 3/1994 | Jannson et al. |
| 5,312,512 A | 5/1994 | Allman et al. |
| 5,312,513 A | 5/1994 | Florence et al. |
| 5,315,370 A | 5/1994 | Bulow |
| 5,327,286 A | 7/1994 | Sampsell et al. |
| 5,381,232 A | 1/1995 | van Wijk |
| 5,474,865 A | 12/1995 | Vasudev |
| 5,488,505 A | 1/1996 | Engle |
| 5,506,597 A | 4/1996 | Thompson et al. |
| 5,515,076 A | 5/1996 | Thompson et al. |
| 5,523,803 A | 6/1996 | Urbanus et al. |
| 5,526,688 A | 6/1996 | Boysel et al. |
| 5,563,398 A | 10/1996 | Sampsell |
| 5,578,976 A | 11/1996 | Yao |
| 5,597,736 A | 1/1997 | Sampsell |
| 5,602,671 A | 2/1997 | Hornbeck |
| 5,629,790 A | 5/1997 | Neukermans et al. |
| 5,638,946 A | 6/1997 | Zavracky |
| 5,665,997 A | 9/1997 | Weaver et al. |
| 5,674,757 A | 10/1997 | Kim |
| 5,706,022 A | 1/1998 | Hato |
| 5,737,050 A | 4/1998 | Takahara et al. |
| 5,771,321 A | 6/1998 | Stern |
| 5,784,189 A | 7/1998 | Bozler et al. |
| 5,818,095 A | 10/1998 | Sampsell |
| 5,822,170 A | 10/1998 | Cabuz et al. |
| 5,824,608 A | 10/1998 | Gotoh et al. |
| 5,835,256 A | 11/1998 | Huibers |
| 5,943,155 A | 8/1999 | Goossen |
| 5,945,980 A | 8/1999 | Moissey et al. |
| 5,959,763 A | 9/1999 | Bozler et al. |
| 5,967,163 A | 10/1999 | Pan et al. |
| 5,976,902 A | 11/1999 | Shih |
| 5,994,174 A | 11/1999 | Carey et al. |
| 6,031,653 A | 2/2000 | Wang |
| 6,040,937 A | 3/2000 | Miles |
| 6,088,162 A | 7/2000 | Someno |
| 6,097,145 A | 8/2000 | Kastalsky et al. |
| 6,099,132 A | 8/2000 | Kaeriyama |
| 6,137,150 A | 10/2000 | Takeuchi et al. |
| 6,158,156 A | 12/2000 | Patrick |
| 6,160,833 A | 12/2000 | Floyd et al. |
| 6,171,945 B1 | 1/2001 | Mandal et al. |
| 6,194,323 B1 | 2/2001 | Downey et al. |
| 6,201,633 B1 | 3/2001 | Peeters et al. |
| 6,219,015 B1 | 4/2001 | Bloom et al. |
| 6,243,149 B1 | 6/2001 | Swanson et al. |
| 6,249,039 B1 | 6/2001 | Harvey et al. |
| 6,275,220 B1 | 8/2001 | Nitta |
| 6,282,010 B1 | 8/2001 | Sulzbach et al. |
| 6,288,824 B1 | 9/2001 | Kastalsky |
| 6,323,982 B1 | 11/2001 | Hornbeck |
| 6,327,071 B1 | 12/2001 | Kimura |
| 6,333,556 B1 | 12/2001 | Juengling et al. |
| 6,335,224 B1 | 1/2002 | Peterson |
| 6,340,435 B1 | 1/2002 | Bjorkman et al. |
| 6,376,787 B1 | 4/2002 | Martin et al. |
| 6,391,675 B1 | 5/2002 | Ehmke et al. |
| 6,392,781 B1 | 5/2002 | Kim et al. |
| 6,399,257 B1 | 6/2002 | Shirota et al. |
| 6,424,094 B1 | 7/2002 | Feldman |
| 6,438,282 B1 | 8/2002 | Takeda et al. |
| 6,449,084 B1 | 9/2002 | Guo |
| 6,452,124 B1 | 9/2002 | York et al. |
| 6,452,465 B1 | 9/2002 | Brown et al. |
| 6,466,354 B1 | 10/2002 | Gudeman |
| 6,466,358 B2 | 10/2002 | Tew |
| 6,513,911 B1 | 2/2003 | Ozaki et al. |
| 6,549,195 B2 | 4/2003 | Hikida et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,589,625 B1 | 7/2003 | Kothari et al. |
| 6,600,201 B2 | 7/2003 | Hartwell et al. |
| 6,608,268 B1 | 8/2003 | Goldsmith |
| 6,624,944 B1 | 9/2003 | Wallace et al. |
| 6,639,724 B2 | 10/2003 | Bower et al. |
| 6,643,069 B2 | 11/2003 | Dewald |
| 6,650,455 B2 | 11/2003 | Miles |
| 6,653,997 B2 | 11/2003 | Van Gorkom et al. |
| 6,660,656 B2 | 12/2003 | Cheung et al. |
| 6,671,149 B1 | 12/2003 | Chea et al. |
| 6,674,562 B1 | 1/2004 | Miles |
| 6,720,267 B1 | 4/2004 | Chen et al. |
| 6,741,377 B2 | 5/2004 | Miles |
| 6,743,570 B2 | 6/2004 | Harnett et al. |
| 6,747,785 B2 | 6/2004 | Chen et al. |
| 6,747,800 B1 | 6/2004 | Lin |
| 6,791,441 B2 | 9/2004 | Pillans et al. |
| 6,794,119 B2 | 9/2004 | Miles |
| 6,803,534 B1 | 10/2004 | Chen et al. |
| 6,806,557 B2 | 10/2004 | Ding |
| 6,809,788 B2 | 10/2004 | Yamada et al. |
| 6,811,267 B1 | 11/2004 | Allen et al. |
| 6,819,469 B1 | 11/2004 | Koba |
| 6,844,959 B2 | 1/2005 | Huibers et al. |
| 6,855,610 B2 | 2/2005 | Tung et al. |
| 6,858,080 B2 | 2/2005 | Linares et al. |
| 6,859,301 B1 | 2/2005 | Islam et al. |
| 6,870,581 B2 | 3/2005 | Li et al. |
| 6,906,847 B2 | 6/2005 | Huibers et al. |
| 6,912,022 B2 | 6/2005 | Lin et al. |
| 6,912,082 B1 | 6/2005 | Lu et al. |
| 6,940,631 B2 | 9/2005 | Ishikawa |
| 6,947,200 B2 | 9/2005 | Huibers |
| 6,952,303 B2 | 10/2005 | Lin et al. |
| 6,958,847 B2 | 10/2005 | Lin |
| 6,959,990 B2 | 11/2005 | Penn |
| 6,980,350 B2 | 12/2005 | Hung et al. |
| 6,995,890 B2 | 2/2006 | Lin |
| 6,999,225 B2 | 2/2006 | Lin |
| 6,999,236 B2 | 2/2006 | Lin |
| 7,016,099 B2 | 3/2006 | Ikeda et al. |
| 7,049,164 B2 | 5/2006 | Bruner |
| 7,064,880 B2 | 6/2006 | Mushika |
| 7,078,293 B2 | 7/2006 | Lin et al. |
| 7,110,158 B2 | 9/2006 | Miles |
| 7,123,216 B1 | 10/2006 | Miles |
| 7,126,741 B2 | 10/2006 | Wagner et al. |
| 7,142,346 B2 | 11/2006 | Chui et al. |
| 7,145,213 B1 | 12/2006 | Ebel |
| 7,161,730 B2 | 1/2007 | Floyd |
| 7,172,915 B2 | 2/2007 | Lin et al. |
| 7,184,202 B2 | 2/2007 | Miles et al. |
| 7,250,315 B2 | 7/2007 | Miles |
| 7,256,922 B2 | 8/2007 | Chui et al. |
| 7,259,865 B2 | 8/2007 | Cummings et al. |
| 7,323,217 B2 | 1/2008 | Lin et al. |
| 7,349,136 B2 | 3/2008 | Chui |
| 7,369,292 B2 | 5/2008 | Xu et al. |
| 2001/0010953 A1 | 8/2001 | Kang et al. |
| 2001/0026951 A1 | 10/2001 | Vergani et al. |
| 2001/0040649 A1 | 11/2001 | Ozaki |
| 2001/0055208 A1 | 12/2001 | Kimura |
| 2002/0014579 A1 | 2/2002 | Dunfield |
| 2002/0036304 A1 | 3/2002 | Ehmke et al. |
| 2002/0058422 A1 | 5/2002 | Jang et al. |
| 2002/0070931 A1 | 6/2002 | Ishikawa |

| | | | | | | |
|---|---|---|---|---|---|---|
| 2002/0109899 A1 | 8/2002 | Ohtaka et al. | | 2007/0019280 A1 | 1/2007 | Sasagawa et al. |
| 2002/0114558 A1 | 8/2002 | Nemirovsky | | 2007/0103028 A1 | 5/2007 | Lewis et al. |
| 2002/0145185 A1 | 10/2002 | Shrauger | | 2007/0121205 A1 | 5/2007 | Miles |
| 2002/0149850 A1 | 10/2002 | Heffner et al. | | 2007/0206267 A1 | 9/2007 | Tung et al. |
| 2002/0167072 A1 | 11/2002 | Andosca | | 2007/0236774 A1 | 10/2007 | Gousev et al. |
| 2002/0167730 A1 | 11/2002 | Needham et al. | | 2007/0285761 A1 | 12/2007 | Zhong et al. |
| 2002/0171610 A1 | 11/2002 | Siwinski et al. | | 2008/0030825 A1 | 2/2008 | Sasagawa et al. |
| 2002/0186209 A1 | 12/2002 | Cok | | 2008/0032439 A1 | 2/2008 | Yan et al. |
| 2002/0195681 A1 | 12/2002 | Melendez et al. | | 2008/0093688 A1 | 4/2008 | Cummings et al. |
| 2003/0007107 A1 | 1/2003 | Chae | | 2008/0144163 A1 | 6/2008 | Floyd |
| 2003/0015936 A1 | 1/2003 | Yoon et al. | | 2008/0151352 A1 | 6/2008 | Chung et al. |
| 2003/0021004 A1 | 1/2003 | Cunningham et al. | | 2008/0158645 A1 | 7/2008 | Chiang |
| 2003/0053078 A1 | 3/2003 | Missey et al. | | 2008/0192328 A1 | 8/2008 | Chui |
| 2003/0077843 A1 | 4/2003 | Yamauchi et al. | | 2008/0192329 A1 | 8/2008 | Chui |
| 2003/0102771 A1 | 6/2003 | Akiba et al. | | 2008/0218840 A1 | 9/2008 | Qui et al. |
| 2003/0118920 A1 | 6/2003 | Johnstone et al. | | 2008/0231931 A1 | 9/2008 | Londergan et al. |
| 2003/0123123 A1 | 7/2003 | Huffman | | 2008/0239449 A1 | 10/2008 | Xu et al. |
| 2003/0123125 A1 | 7/2003 | Little | | 2008/0268620 A1 | 10/2008 | Floyd |
| 2003/0132822 A1 | 7/2003 | Ko et al. | | 2008/0279498 A1 | 11/2008 | Sampsell et al. |
| 2003/0156315 A1 | 8/2003 | Li et al. | | | | |
| 2003/0164350 A1 | 9/2003 | Hanson et al. | | FOREIGN PATENT DOCUMENTS | | |
| 2003/0179527 A1 | 9/2003 | Chea | | | | |
| 2003/0210851 A1 | 11/2003 | Fu et al. | | CN | 157313 | 5/1991 |
| 2004/0058531 A1 | 3/2004 | Hsieh et al. | | EP | 0 667 548 | 8/1995 |
| 2004/0058532 A1 | 3/2004 | Miles et al. | | EP | 1 170 618 | 1/2002 |
| 2004/0061543 A1 | 4/2004 | Nam et al. | | EP | 1 243 550 | 9/2002 |
| 2004/0080035 A1 | 4/2004 | Delapierre | | EP | 1 452 481 | 9/2004 |
| 2004/0080807 A1 | 4/2004 | Chen et al. | | EP | 1 473 581 | 11/2004 |
| 2004/0100594 A1 | 5/2004 | Huibers et al. | | EP | 1 484 635 | 12/2004 |
| 2004/0100677 A1 | 5/2004 | Huibers et al. | | JP | 02-068513 | 3/1990 |
| 2004/0124073 A1 | 7/2004 | Pilans et al. | | JP | 6-281956 | 10/1994 |
| 2004/0125281 A1 | 7/2004 | Lin et al. | | JP | 7-45550 | 2/1995 |
| 2004/0125282 A1 | 7/2004 | Lin et al. | | JP | 09-036387 | 2/1997 |
| 2004/0125347 A1 | 7/2004 | Patel et al. | | JP | 10-116996 | 5/1998 |
| 2004/0125536 A1 | 7/2004 | Arney et al. | | JP | 11-243214 | 9/1999 |
| 2004/0136076 A1 | 7/2004 | Tayebati | | JP | 11-263012 | 9/1999 |
| 2004/0140557 A1 | 7/2004 | Sun et al. | | JP | 2000-40831 | 2/2000 |
| 2004/0150869 A1 | 8/2004 | Kasai | | JP | 2002-062505 | 2/2002 |
| 2004/0150936 A1 | 8/2004 | Chea, Jr. | | JP | 2002-296521 | 10/2002 |
| 2004/0150939 A1 | 8/2004 | Huff | | JP | 2002-341267 | 11/2002 |
| 2004/0175577 A1 | 9/2004 | Lin et al. | | JP | 2003-057571 | 2/2003 |
| 2004/0191937 A1 | 9/2004 | Patel et al. | | JP | 2003195201 | 7/2003 |
| 2004/0217264 A1 | 11/2004 | Wood et al. | | JP | 2005051007 | 2/2005 |
| 2004/0217919 A1 | 11/2004 | Pichl et al. | | KR | 2002-9270 | 10/1999 |
| 2004/0233503 A1 | 11/2004 | Kimura | | WO | WO 97-17628 | 5/1997 |
| 2005/0012577 A1 | 1/2005 | Pillans et al. | | WO | WO 99/34484 | 7/1999 |
| 2005/0012975 A1 | 1/2005 | George et al. | | WO | WO 03/046508 | 6/2003 |
| 2005/0024557 A1 | 2/2005 | Lin | | WO | WO 03-052506 | 6/2003 |
| 2005/0030490 A1 | 2/2005 | Huibers | | WO | WO 04/000717 | 12/2003 |
| 2005/0035699 A1 | 2/2005 | Tsai | | WO | WO 2004/015741 | 2/2004 |
| 2005/0042117 A1 | 2/2005 | Lin | | WO | WO 2004/035461 | 4/2004 |
| 2005/0046919 A1 | 3/2005 | Taguchi et al. | | WO | WO 2005/066596 | 7/2005 |
| 2005/0046922 A1 | 3/2005 | Lin et al. | | WO | WO 2005/124869 | 12/2005 |
| 2005/0057442 A1 | 3/2005 | Way | | WO | WO 2007/041302 | 4/2007 |
| 2005/0078348 A1 | 4/2005 | Lin | | | | |
| 2005/0128565 A1 | 6/2005 | Ljungblad | | | | |
| 2005/0249966 A1 | 11/2005 | Tung et al. | | | | |
| 2005/0250235 A1 | 11/2005 | Miles et al. | | | | |
| 2005/0253820 A1 | 11/2005 | Horiuchi | | | | |
| 2006/0024880 A1 | 2/2006 | Chui et al. | | | | |
| 2006/0050393 A1 | 3/2006 | Lin et al. | | | | |
| 2006/0056001 A1 | 3/2006 | Taguchi et al. | | | | |
| 2006/0066511 A1 | 3/2006 | Chui | | | | |
| 2006/0066935 A1 | 3/2006 | Cummings et al. | | | | |
| 2006/0067646 A1 | 3/2006 | Chui | | | | |
| 2006/0077151 A1 | 4/2006 | Chui | | | | |
| 2006/0077504 A1 | 4/2006 | Floyd | | | | |
| 2006/0077528 A1 | 4/2006 | Floyd | | | | |
| 2006/0077529 A1 | 4/2006 | Chui et al. | | | | |
| 2006/0091824 A1 | 5/2006 | Pate et al. | | | | |
| 2006/0094143 A1 | 5/2006 | Haluzak | | | | |
| 2006/0209386 A1 | 9/2006 | Sudak et al. | | | | |
| 2006/0261330 A1 | 11/2006 | Miles | | | | |

OTHER PUBLICATIONS

Hall, Integrated optical inteferometric detection method for micromachined capacitiive acoustic transducers, App. Phy. Let. 80:20(3859-3961) May 20, 2002.

Matsumoto et al., Novel prevention method of stiction using silicon anodization for SOI structure, Sensors and Actuators, 72:2(153-159) Jan. 19, 1999.

Watanabe et al., Reduction of microtrenching and island formation in oxide plasma etching by employing electron beam charge neutralization, Applied Physics Letters, 79:17(2698-2700), Oct. 22, 2001.

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 (Jun. 1996) IOP Publishing.

Furneaux, et al. "The Formation of Controlled-porosity membranes from Anodically Oxidized Aluminium" Nature vo 337 Jan. 12, 1989, pp. 147-149.

Goossen et al., "Possible Display Applications of the Silicon Mechanical Anti-Reflection Switch," Society for Information Display (1994).

Kawamura et al., Fabrication of fine metal microstructures packaged in the bonded glass substrates, Proceedings of SPIE, vol. 3893, pp. 486-493, 1999.

Kim et al., "Control of Optical Transmission Through Metals Perforated With Subwavelength Hole Arrays," Optic Letters, vol. 24, No. 4, pp. 256-257, (Feb. 1999).

Xactix Xetch X# Specifications, http:—www.xactix.com-Xtech X3specs.htm, Jan. 5, 2005.

International Search Report and Written Opinion for PCT Application No. PCT/US2008/071498, dated May 15, 2009.

MEMS DEVICE AND INTERCONNECTS FOR SAME

BACKGROUND

1. Field

The field of the invention relates to microelectromechanical systems (MEMS). More specifically, the field of the invention relates to fabricating electrical interconnects for MEMS.

2. Description of the Related Technology

Microelectromechanical systems (MEMS) include micro mechanical elements, actuators, and electronics. Micromechanical elements may be created using deposition, etching, and/or other micromachining processes that remove parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a peripheral routing region of a microelectromechanical systems device. The peripheral routing region includes an electrical interconnect, a partially reflective layer, and a transparent conductor. The electrical interconnect includes a conductive layer comprising a material selected from the group consisting of nickel, copper, chromium, and silver. At least a portion of the conductive layer is directly under, directly over, or between the partially reflective layer and the transparent conductor.

According to another embodiment, a microelectromechanical systems device is provided, comprising an array and a peripheral region. The array comprises a lower electrode, a movable upper electrode, and a cavity between the lower electrode and the upper electrode. The peripheral region comprises a portion of a layer forming the upper electrode in the array and an electrical interconnect electrically connected to at least one of the lower electrode and the upper electrode. The electrical interconnect is formed of a layer separate from and below the layer forming the upper electrode in the array and the electrical interconnect comprises a material selected from the group consisting of nickel, chromium, copper, and silver.

According to yet another embodiment, a method is provided for making a microelectromechanical systems device. A first electrode layer is deposited over a transparent substrate. The first electrode layer is patterned to form lower electrodes in an array region. A conductive layer is formed over the transparent substrate, wherein the conductive layer comprises a material selected from the group consisting of nickel, copper, chromium, and silver. The conductive layer is patterned to form a pattern for an electrical interconnect in a peripheral region. A sacrificial layer is deposited over the lower electrodes in the array region. A second electrode layer is then deposited over the sacrificial layer after patterning the conductive layer to form upper electrodes in the array region.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

According to embodiments described herein, a microelectromechanical systems (MEMS) device and method for making the device are provided. The device includes an electrical interconnect layer connected to at least one of an electrode and a movable layer (e.g., aluminum used as a reflector in an interferometric modulator) within the device. In the periphery or routing region of the substrate, at least a portion of the electrical interconnect is formed directly under, over, or between a partially reflective layer and a transparent layer that form the lower electrode in the array region of the substrate of the device. The electrical interconnect preferably comprises nickel.

Figure 1:
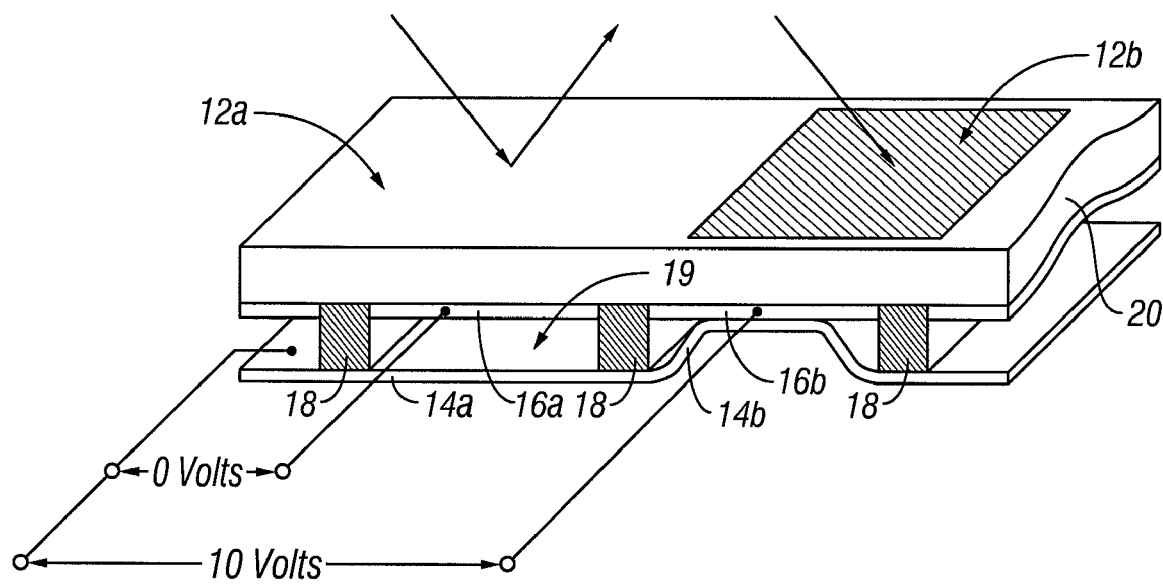
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
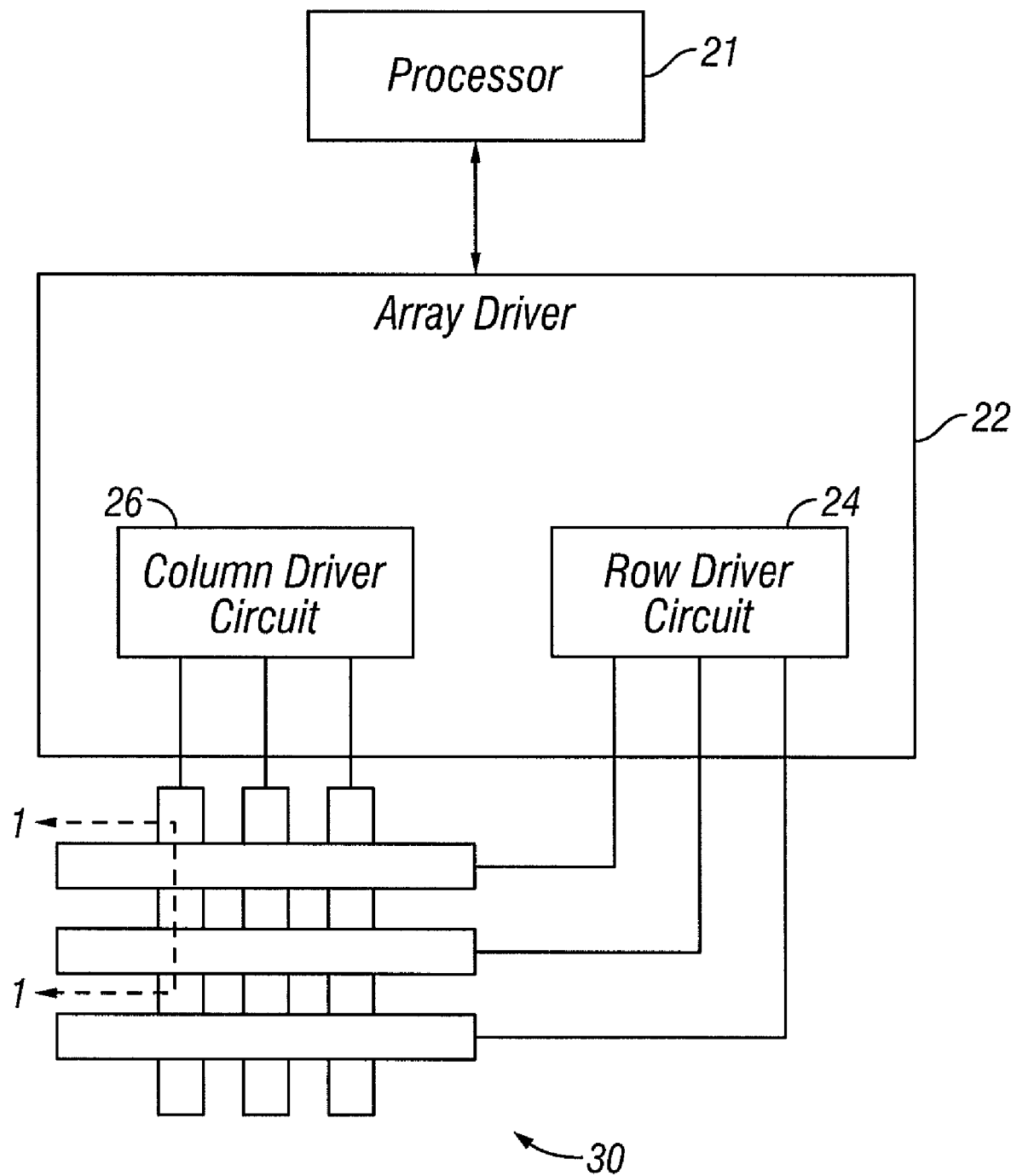
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
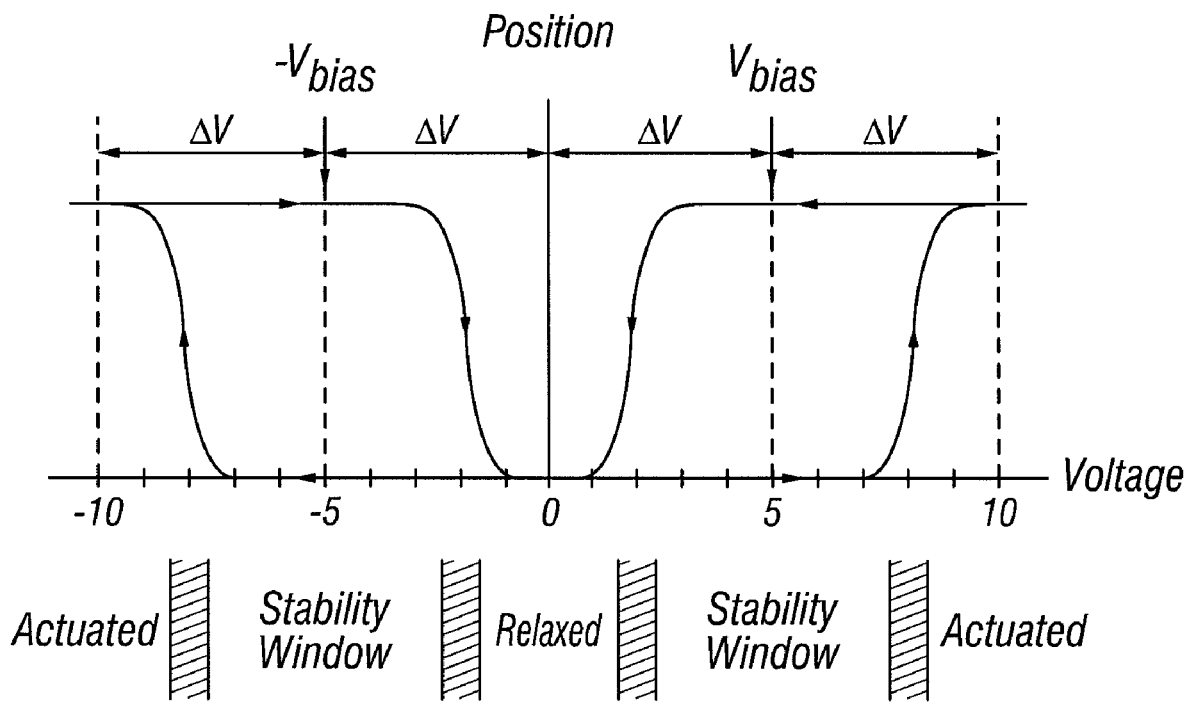
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
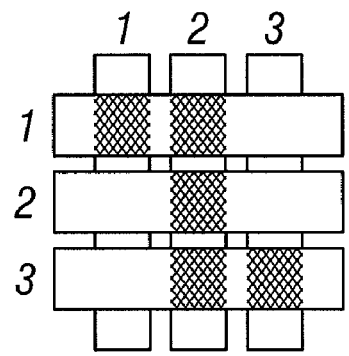
FIGS. 5A and 5B illustrate one exemplary timing diagram for row and column signals that may be used to write a frame of display data to the 3×3 interferometric modulator display of FIG. 2.
Figure 5B:
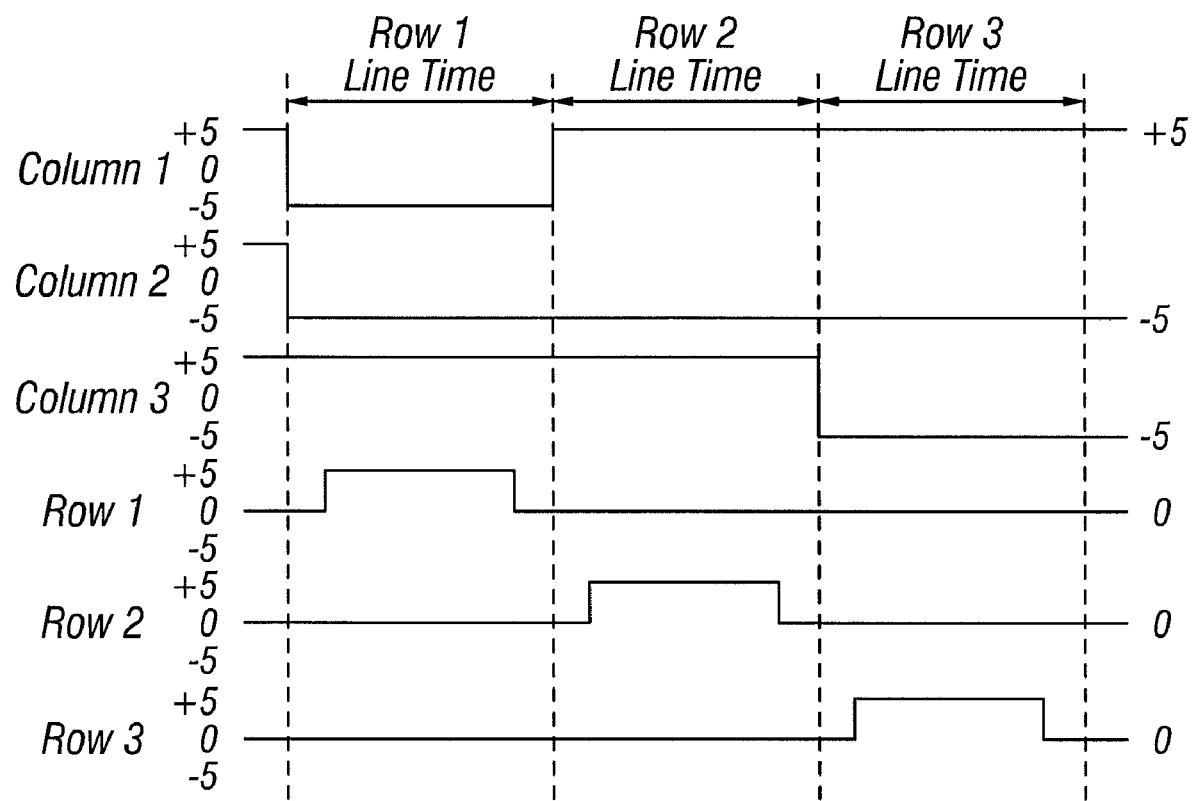

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
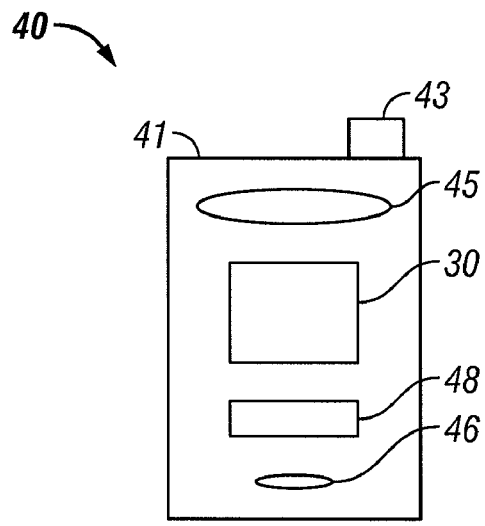
FIGS. 6A and 6B are system block diagrams illustrating an embodiment of a visual display device comprising a plurality of interferometric modulators.
Figure 6B:
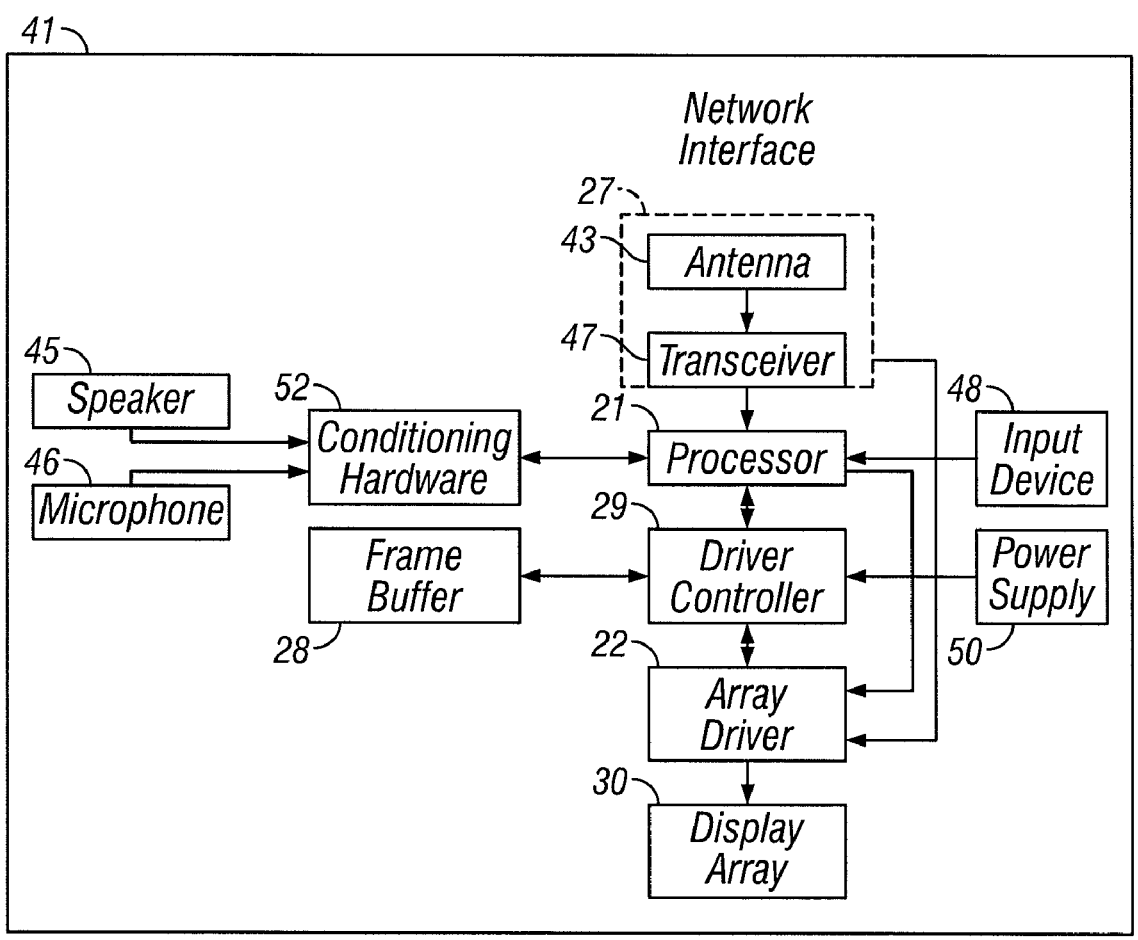

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
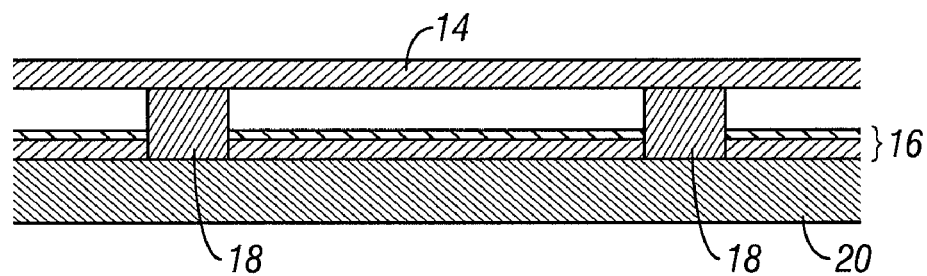
FIG. 7A is a cross section of the device of FIG. 1.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. The supports 18 can comprise isolated posts or continuous walls. For example, the supports 18 can include linear rails that support crossing strips of mechanical or movable material, and/or isolated posts. In one example, rails provide primary support and posts within each cavity serve to stiffen the mechanical layer.

Figure 7B:
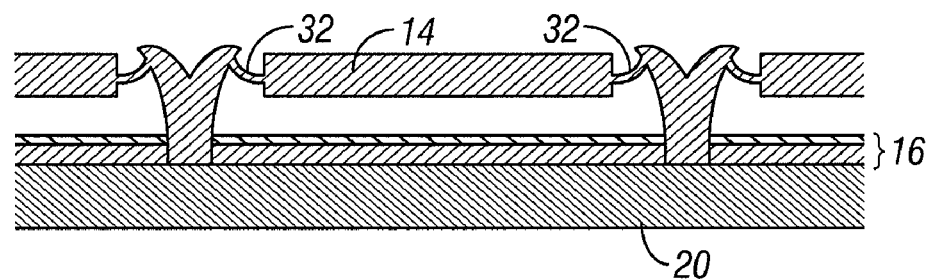
FIG. 7B is a cross section of an alternative embodiment of an interferometric modulator.
Figure 7C:
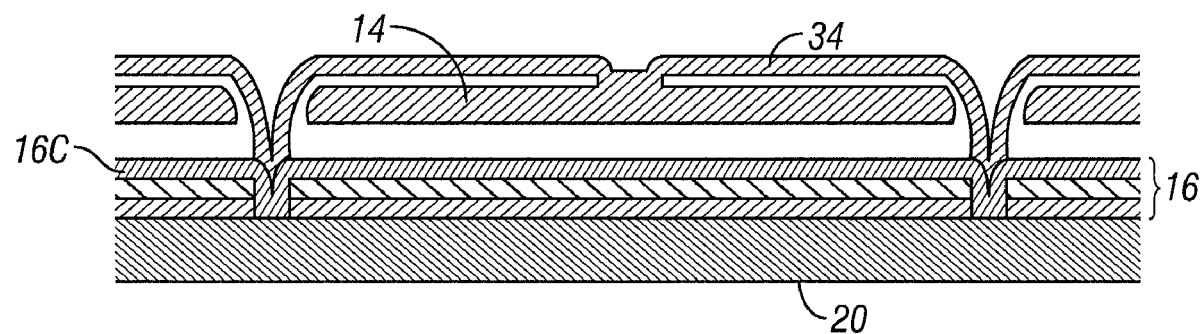
FIG. 7C is a cross section of another alternative embodiment of an interferometric modulator.
Figure 7D:
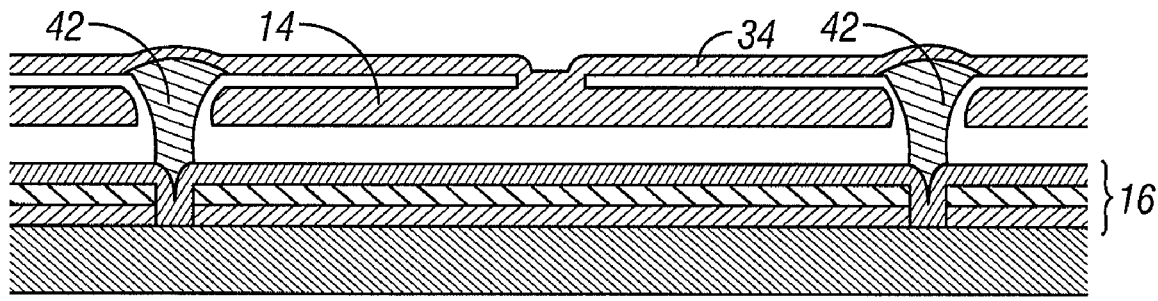
FIG. 7D is a cross section of yet another alternative embodiment of an interferometric modulator.
Figure 7E:
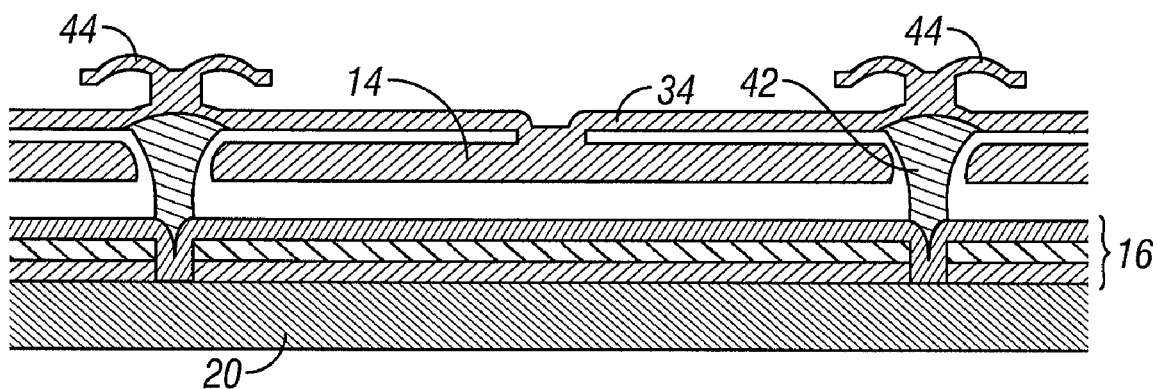
FIG. 7E is a cross section of an additional alternative embodiment of an interferometric modulator.

In FIG. 7B, the moveable reflective layer 14 is attached to supports at the corners only, on tethers 32. In FIG. 7C, the moveable reflective layer 14 is suspended from a deformable mechanical layer 34, which may comprise a flexible metal. The deformable mechanical layer 34 connects, directly or indirectly, to the substrate 20 around the perimeter of the deformable mechanical layer 34. These connections are herein referred to as support structures or supports 18. The embodiment illustrated in FIG. 7D has supports 18 that include post plugs 42 upon which the deformable layer 34 rests. The movable reflective layer 14 remains suspended over the gap, as in FIGS. 7A-7C, but the mechanical layer 34 does not form the support posts by filling holes between the mechanical layer 34 and the optical stack 16. Rather, supports 18 are separately deposited under the mechanical layer 34. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable mechanical layer 34. This allows the structural design and materials used for the reflective layer 14 to be optimized with respect to the optical properties, and the structural design and materials used for the deformable layer 34 to be optimized with respect to desired mechanical properties.

Layers, materials, and/or other structural elements may be described herein as being "over," "above," "between," etc. in relation to other structural elements. As used herein, these terms can mean directly or indirectly on, over, above, between, etc., as a variety of intermediate layers, material, and/or other structural elements can be interposed between structural elements described herein. Similarly, structural elements described herein, such as substrates or layers, can comprise a single component (e.g., a monolayer) or a multi-component structure (e.g., a laminate comprising multiple layers of the recited material, with or without layers of additional materials). Use of the term "one or more" with respect to an object or element does not, in any way, indicate the absence of a potential plural arrangement of objects or elements for which the term is not used. The term "microelectromechanical device," as used herein, refers generally to any such device at any stage of manufacture.

Methods disclosed herein employ depositions of conductive layers for use in the MEMS array to simultaneously form peripheral electrical interconnect or routing layers. In some options for forming a microelectromechanical system (e.g., an interferometric modulator), depositions that form the upper electrode (e.g., the reflective layer 14) and/or the lower electrode (e.g., layers of the optical stack 16), can also be used to provide electrical interconnect and routing in the periphery of the display, where the interconnect electrically connects circuitry outside the array (e.g., driver chip(s) at a contact pad) to an electrode (row or column) within the array.

A first exemplary process will be described with reference to FIGS. 8A-8L. It will be understood that FIGS. 8A-8L are cross-sectional views of the row or lower electrodes of the device. While the peripheral interconnects are formed by multiple layers, including layers that form MEMS electrodes in the array regions, one of those layers is formed exclusively in the peripheral region and does not serve as part of the array electrodes. According to this embodiment, the peripheral routing/interconnect includes a conductive layer comprising nickel (Ni), chromium (Cr), copper (Cu), or silver (Ag) and at least a portion of the conductive layer is directly under, over, or between a transparent layer and a partially reflective layer within the MEMS device.

With reference to FIGS. 8A-8L, an optical stack 16 is formed over the transparent substrate 20 in one embodiment. According to this embodiment, the transparent substrate 20 is covered with ITO 16A, which is a transparent conductive material for forming the lower electrodes of the device. In alternative embodiments, the transparent substrate can be covered with indium zinc oxide (IZO) or zinc oxide (ZnO) instead of ITO. The ITO 16A of the optical stack 16 may be deposited by standard deposition techniques, such as physical vapor deposition (PVD), including sputtering and evaporation. A relatively thin, partially reflective absorber layer 16B of, e.g., MoCr, Cr, Ta, $TaN_x$, or W, is preferably deposited over the ITO 16A. The skilled artisan will appreciate that the absorber layer 16B may comprise any material capable of being optically partially reflective.

Figure 8A:
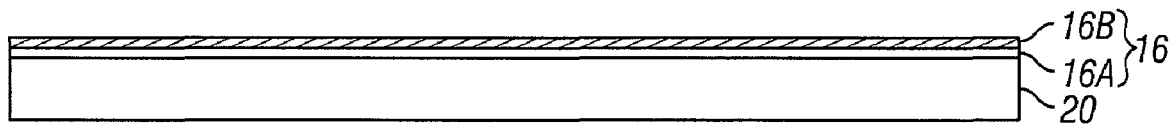
FIGS. 8A-8L are cross sections showing a process for making an embodiment of an interferometric modulator.
Figure 8B:
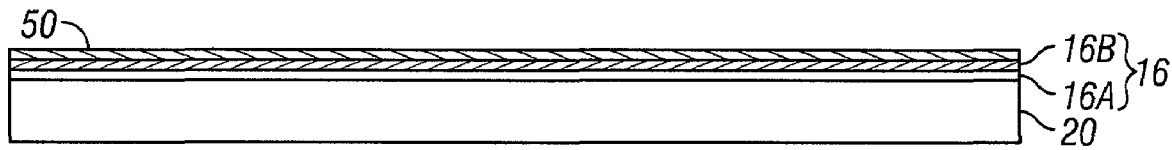

As shown in FIG. 8B, one or more layers of a conductive material 50, comprising, e.g., Ni, Cu, Ag, or their alloys, is deposited over the absorber layer 16B to contact the ITO of the optical stack 16. This material 50 is used to create at least a portion of the electrical interconnect structures. As will be described in more detail below, the interconnect or routing can electrically connect circuitry on a contact pad outside the array with either the lower or row electrodes (e.g., conductive layers of the optical stack 16 in the array region) or the patterned electrode/movable layer still to be formed, or both. As shown in FIG. 8B, a layer of conductive material 50 is preferably deposited over the absorber layer 16B.

Figure 8C:
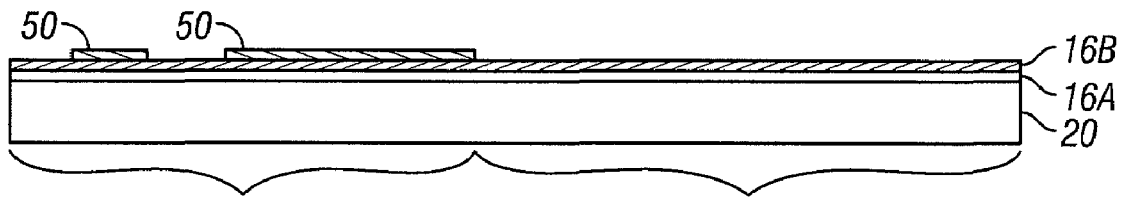

The conductive material 50 is then etched and patterned, such that it remains only in the interconnect or peripheral region in a desired pattern for the interconnect routing, as illustrated in FIG. 8C. For example, the conductive material 50 is patterned for connecting the row electrodes (to be patterned, as discussed with respect to FIG. 8D) to row drivers. The conductive material 50 can additionally or instead be patterned for routing the upper, column electrodes to be formed, to column drivers. For example, a conductive material 50 comprising Ni is etched, preferably with a diluted $HNO_3$ solution (<15%). In another embodiment where the conductive material 50 comprises Cu, various etching solutions can be used, including $(NH_4)_2S_2O_8$+deionized water, diluted $HNO_3$ (<15%), $NH_4OH+H_2O_2$, and a potassium iodine solution $(KI+I_2+H_2O)$. In an embodiment where the conductive material 50 comprises Ag, etching solutions, such as $NH_4OH+H_2O_2$ and a potassium iodine solution $(KI+I_2+H_2O)$, can be used.

The conductive material 50 has a thickness preferably in the range of about 200 Å-5 µm, depending on the resistivity of the conductive material 50 and the required routing conductance. For conductive material 50 comprising Ni, the thickness of the conductive material 50 is preferably in the range of about 500 Å-2000 Å, and more preferably is about 1000 Å. As will described below, this conductive material 50 can also function as a barrier layer in the interconnect region. Although the conductive material 50 is illustrated as being deposited over the entire structure, as shown in FIG. 8B, it will be understood that, in alternative embodiments, the conductive material 50 may be selectively deposited only in the interconnect region. Thus, it will be understood that the conductive material 50 is deposited at least in the interconnect region. A lift off process can also be used to deposit the conductive material 50 in the interconnect region. According to such a lift off process, a layer of photoresist is coated over areas where the conductive material 50 is to be removed. A layer of the conductive material 50 is then deposited and then selectively removed in areas where the conductive material 50 is over the photoresist, using a photoresist stripper or other stripping chemicals, such as acetone.

The conductive material 50 is preferably formed from nickel because nickel provides good electrical contact between the reflective layer (e.g., aluminum mirror) in the movable upper electrode layer and the ITO (lower electrode) of the optical stack 16. The skilled artisan will appreciate that, in other embodiments, the conductive material 50 may be formed of other conductive materials that are resistant to fluorine-based etchants (e.g., $XeF_2$) and provide good electrical contact between the reflective layer of the movable layer and the ITO of the optical stack 16, such as, for example, copper (Cu), chromium (Cr), silver (Ag), and their alloys.

Figure 8D:
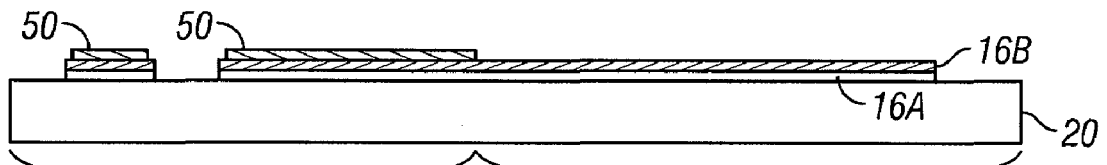

In this embodiment, the transparent conductor 16A and the absorber layer 16B are then etched and patterned into rows to form the lower electrodes of the optical stack 16, as illustrated in FIG. 8D. According to a preferred embodiment, the absorber layer 16B is etched first, preferably using a chrome etch, such as CR-14 (Ceric Ammonium Nitrate $Ce(NH_4)_2(NO_3)_6$ 22%, Acetic Acid 9%, Water 69%) to etch Cr or using a PAN (Phosphoric acid, Acetic acid, Nitric acid) etch to etch MoCr. According to this embodiment, the conductors of the optical stack 16 are masked together, and after the MoCr or Cr layer 16B is etched, the ITO of the transparent conductor 16*a* is etched, preferably using an etchant, such as HCl, HBr, $HCl+HNO_3$, and $FeCl_3/HCl/DI$.

In other embodiments, the conductive material 50 is patterned to form the electrical interconnect structure after the transparent conductor 16A and absorber layer 16B are patterned to form the electrodes of the optical stack 16.

Figure 8E:
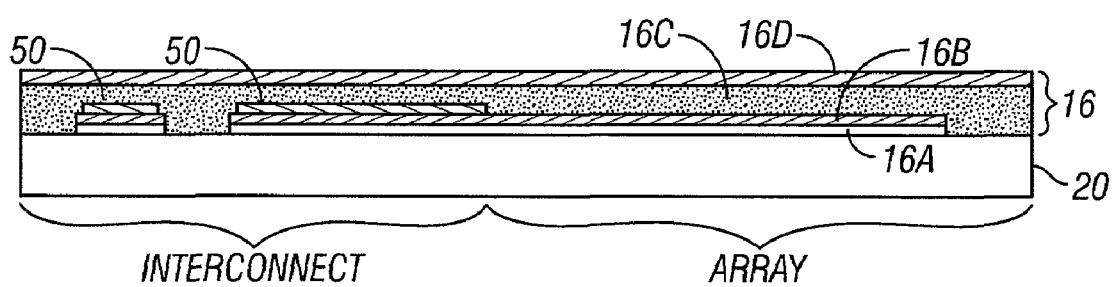

As described above, the optical stack 16 also includes a dielectric layer 16*c* (e.g., silicon dioxide $(SiO_2)$) to provide electrical isolation during operation between the row electrodes and subsequently deposited column electrodes. The dielectric layer 16C can be deposited after patterning the row electrodes. As shown in FIG. 8E, the dielectric layer 16C may be covered with a protective cap layer 16D, such an aluminum oxide $(Al_2O_3)$, to protect it from the release etch performed later in the fabrication sequence. The cap layer 16D can also protect the dielectric layer 16C from a dry etch of the subsequently deposited sacrificial layer 82 (described below), using fluorine-based etchants, such as a sulfur hexafluoride oxygen $(SF_6/O_2)$ plasma etch. In some arrangements, a further etch stop layer (not shown) is formed over the cap layer 16D to protect it during subsequent patterning steps to define multiple thicknesses of sacrificial material to define multiple cavity sizes and corresponding colors. For example, a thin layer of $SiO_2$ of about 100 Å can be deposited over the cap layer 16D to protect the cap layer 16D from a wet etch (using PAN) of the sacrificial layer 82. Desirably, all three of the dielectric 16C, protective cap 16D, and etch stop (not shown) over the conductors 50, 16B, 16A are dielectric, and in the case of the optical MEMS, transparent.

Figure 8F:
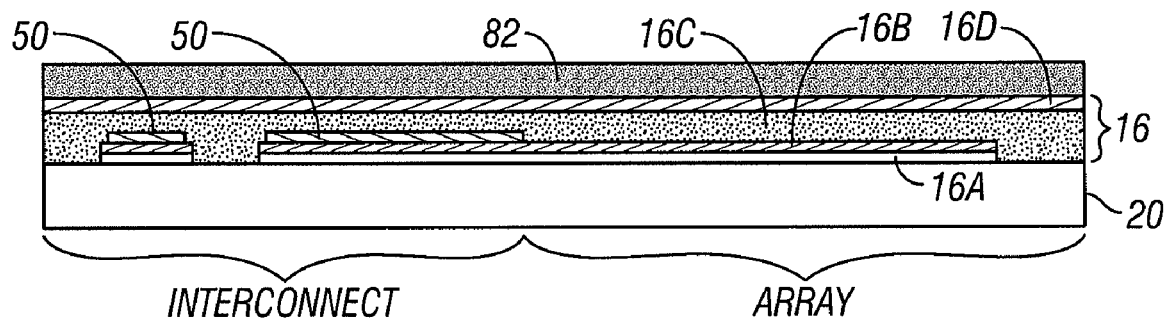

As shown in FIG. 8F, a sacrificial layer (or layers) 82, preferably comprising a material that can be selectively etched by fluorine-based etchants, and particularly molybdenum (Mo), is deposited (and later partially removed in the release etch) over the structure. The skilled artisan will understand that the sacrificial layer 82 may alternatively be selectively deposited only in the image (or "array" or "display") region. The sacrificial layer 82 preferably comprises material(s) selectively etchable, relative to the upper layers of the optical stack 16 (e.g., the dielectric layer 16C, the cap layer 16D, or the overlying etch stop, depending upon the embodiment) and other adjacent materials of the MEMS device. In certain embodiments, this sacrificial layer 82 may comprise, for example, tungsten (W), titanium (Ti), or amorphous silicon.

Figure 8G:
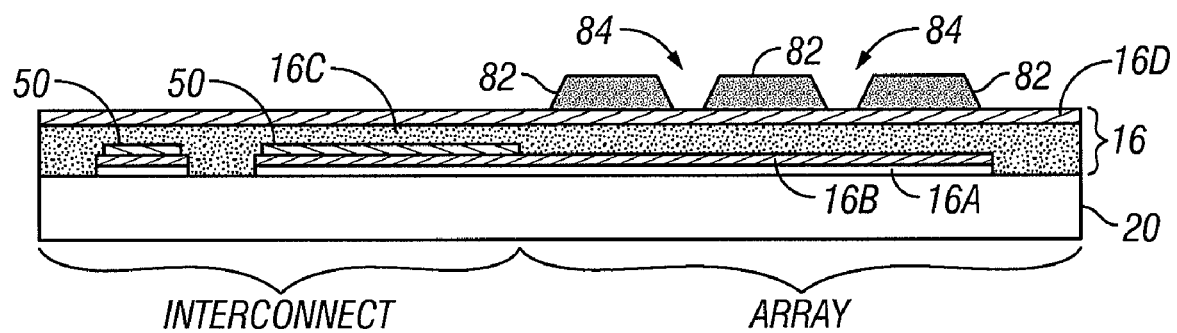

As illustrated in FIG. 8G, according to this embodiment, the sacrificial layer 82 is patterned such that it remains only in the image (or "array" or "display") area. It will be understood that the sacrificial material 82 is preferably deposited (and later selectively removed) over the optical stack 16 to define a resonant optical cavity 19 (FIG. 8L) between the optical stack 16 and a movable layer that will be deposited, as described in more detail below. It will be understood that the sacrificial layer 82 may be selectively deposited or etched in different locations to produce cavities of different heights. For example, the sacrificial layer may comprise multiple layers that are deposited and subsequently patterned to have multiple thicknesses to produce interferometric modulators for reflecting multiple different colors, such as red, green, and blue for an RGB display system. The skilled artisan will appreciate that the sacrificial material 82 is also patterned and etched in order to form vias 84 for support structures (the deposition of which will be described below) in the display or image area of the device, as shown in FIG. 8G. Preferably, a dry etch is performed to pattern the sacrificial layer 82.

Figure 8H:
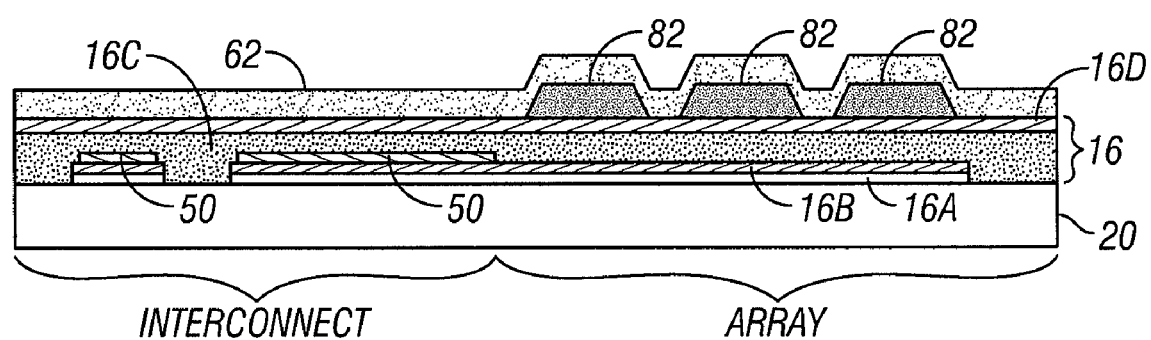

After patterning and etching the sacrificial material 82, a support layer 62, preferably formed of an insulating material, such as silicon dioxide $(SiO_2)$, is deposited over the entire structure, as shown in FIG. 8H. The support layer 62 preferably comprises an inorganic material (e.g., oxide, particularly $SiO_2$).

Figure 8I:
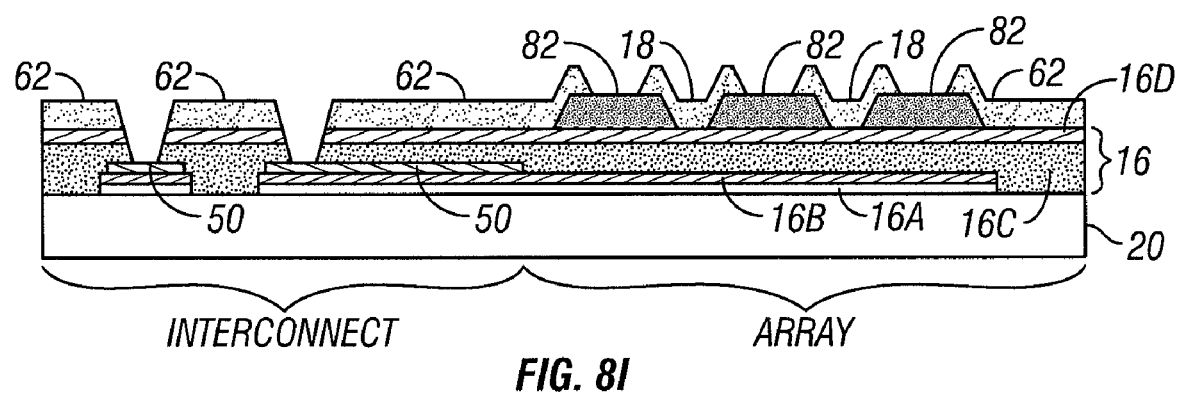

As illustrated in FIG. 8I, this support layer 62 is then patterned to form support structures 18 for the device in the image or display area. In the interconnect region, the support layer 62, together with the dielectric layers of the optical stack 16, serves as an insulator for electrically separating and passivating interconnect structures. The support layer 62 is patterned to form contact openings to the conductive material 50 in the interconnect region, as shown on the left side of FIG. 8I. As shown in FIG. 8I, portions of the cap layer 16D and the dielectric layer 16C of the optical stack 16 are also etched to form the contact openings to the conductive material 50 in the interconnect region. The skilled artisan will appreciate that these contacts may be formed either prior to or after a release etch, which will be described below.

Figure 8J:
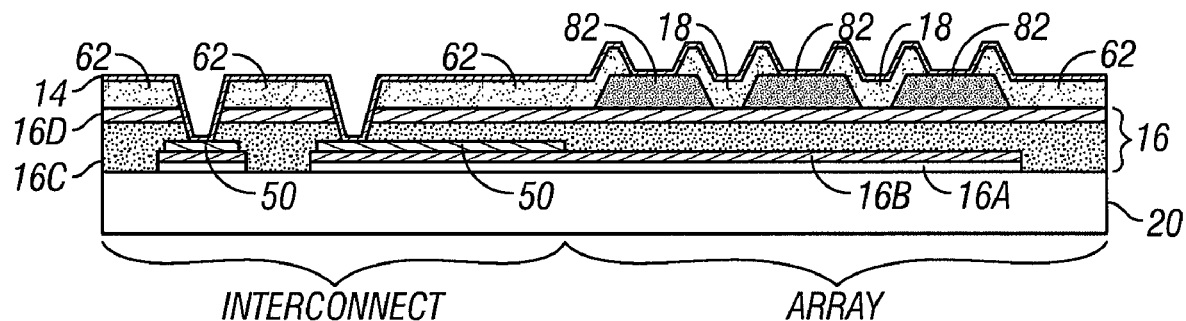

As shown in FIG. 8J, the movable layer 14 is deposited over the entire structure to form the movable upper electrodes of the device in the array region. As noted above, the illustrated movable layer 14 is formed of nickel over aluminum, which is reflective. In other embodiments, the movable layer can be a reflector suspended from a separately patterned deformable layer.

Figure 8K:
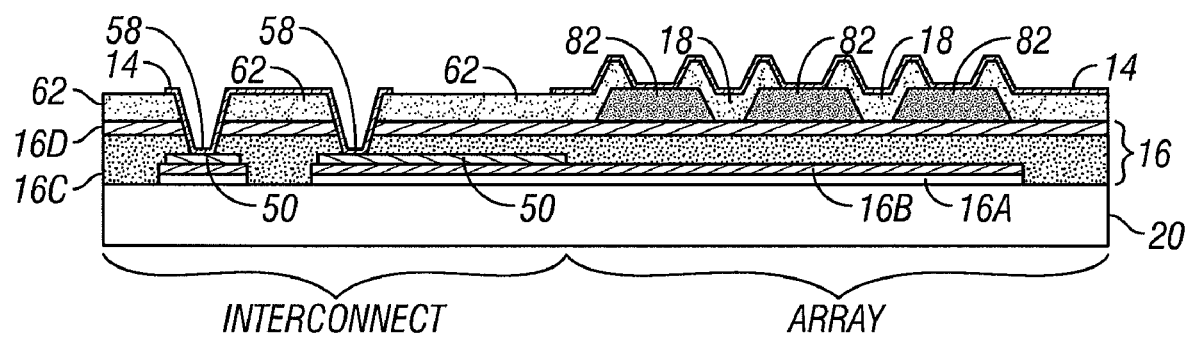

In the array region, the movable layer 14 is deposited and patterned into column electrodes that cross over, e.g., are orthogonal to, the row electrodes of the optical stack 16 to create the row/column array described above. The movable layer 14 is patterned and etched, as shown in FIG. 8K. The skilled artisan will appreciate that holes (not shown) are preferably etched in portions of the movable layer 14 that are over areas of the sacrificial layer 82 to be removed by the release etch (in the image or display area). In the interconnect region, the movable layer 14 is used to form contact pads 58 to the conductive material 50. As shown in FIG. 8K, the conductive material 50 forms a layer of the routing providing electrical contact between the lower electrodes (transparent conductor 16A and optional absorber layer 16B) and contact pads 58 that serve to connect row drivers to be mounted. In the illustrated embodiment, the contact pads include an aluminum layer that serves as an upper electrode and reflector in the array. The aluminum of the movable layer 14 also connects routing regions to contact regions of the interconnect. The conductive material 50 is thus selected from metals that make good electrical contact to aluminum, such as nickel, Cr, Cu, or Ag.

Figure 8L:
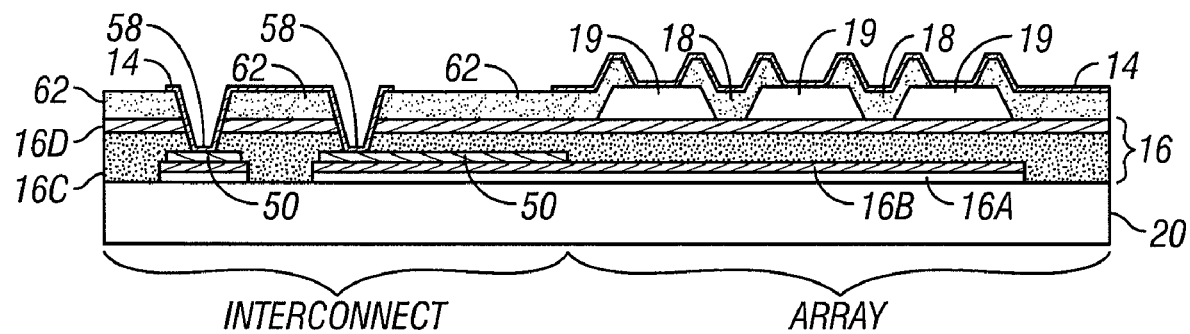

The exposed areas of the sacrificial layer 82 are removed in a release etch, after the movable layer 14 is formed, to create the optical cavities 19 between the fixed lower electrodes of the optical stack 16 and the upper electrodes of the movable layer 14 in the display or image area, as shown in FIG. 8L. Standard release techniques may be used to remove the sacrificial layer 82. The particular release technique will depend on the material to be removed. For example, a fluorine-based etchant, such as xenon difluoride ($XeF_2$), may be used to remove a molybdenum (illustrated), tungsten, or silicon sacrificial layer. The skilled artisan will appreciate that the release etchants are chosen to be selective such that the support structure material 62 and the movable layer 14 will not be removed by the release etch.

The conductive material 50 is provided as an electrical interconnect as well as serving as a barrier layer between the movable layer 14 and the electrodes of the optical stack 16 outside the display or array area. After the release etch, a backplate is preferably sealed to the transparent substrate 20 using a seal to protect the display area of the interferometric modulator. The backplate protects the MEMS device from harmful elements in the environment. Similarly, the seal preferably provides a sufficient barrier for preventing water vapor and other contaminants from entering the package and damaging the MEMS device. The skilled artisan will understand that transparent substrate 20 may be any transparent substance capable of having thin film, MEMS devices built upon it. Such transparent substances include, but are not limited to, glass, plastic, and transparent polymers. Images are displayed through the transparent substrate 20.

Figure 9A:
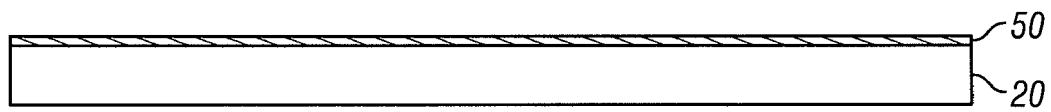
FIGS. 9A-9L are cross sections showing a process for making another embodiment of an interferometric modulator.

According to a second embodiment illustrated in FIGS. 9A-9L, the conductive material 50 forming the interconnect/routing may be deposited on the substrate 20 before the transparent conductor 16A (e.g., ITO) and the partially reflective absorber layer 16B (e.g., MoCr or Cr) of the optical stack 16 are deposited. As shown in FIG. 9A, a layer of conductive material 50, preferably nickel, is deposited directly over the transparent substrate 20. The skilled artisan will appreciate that, in other embodiments, the conductive material 50 may comprise other conductive materials that are resistant to fluorine-based etchants (e.g., $XeF_2$) and provide good electrical contact between the reflective layer of the movable layer and the ITO of the optical stack 16, such as, for example, copper (Cu), chromium (Cr), silver (Ag), and their alloys.

Figure 9B:
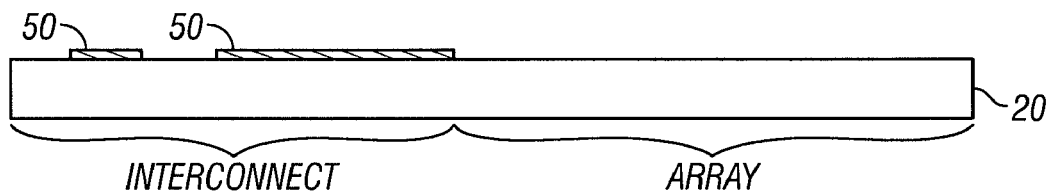
Figure 9C:
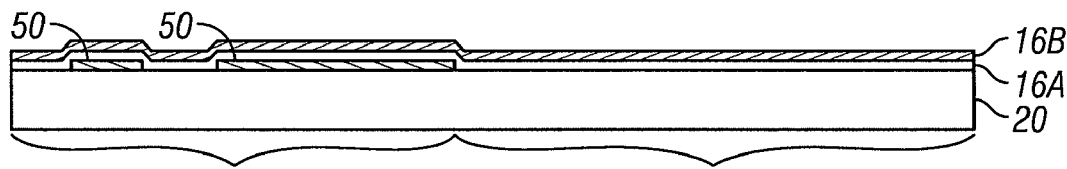
Figure 9D:
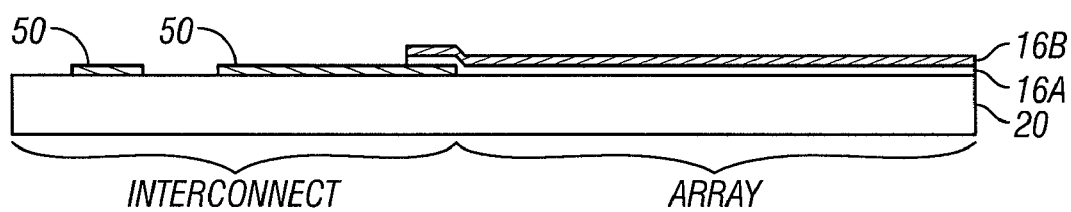

The layer of conductive material 50 is then etched and patterned, as shown in FIG. 9B, where peripheral routing and contact pads of the MEMS device are desired. A conductive material 50 formed of nickel, for example, is preferably etched with a diluted $HNO_3$ solution (preferably <15%). The transparent conductor 16A and absorber 16B layers of the optical stack 16 are then deposited over the structure, as shown in FIG. 9C. The transparent conductor 16A and absorber 16B layers of the optical stack 16 are then etched and patterned into rows to form the lower, fixed electrodes of the optical stack 16 in the array or image region, as illustrated in FIG. 9D. According to a preferred embodiment, the absorber layer 16B is etched (dry or wet etch) first, preferably using a chrome etch, such as CR-14 (Ceric Ammonium Nitrate $Ce(NH_4)_2(NO_3)_6$ 22%, Acetic Acid 9%, Water 69%) to etch Cr or using a PAN (Phosphoric Acid, Acetic Acid, Nitric Acid) etch to etch MoCr. According to this embodiment, after the absorber layer 16B is etched and patterned, the ITO of the transparent conductor layer 16a is etched and patterned, preferably using an etchant, such as HCl:DI or HBr:DI. The skilled artisan will appreciate that HCl and HBr can etch the ITO 16A selectively against the conductive material 50 and that a separate masking step is not necessary. Although the transparent conductor 16A and absorber 16B layers are deposited over the entire structure in the illustrated embodiment, it will be understood that they may be selectively deposited only in the array or image area of the device and subsequently patterned to form the lower electrodes of the device. As shown in FIG. 9D, the patterns for the lower or row electrodes (layers 16A, 16B) and the conductive material 50 overlap such that the conductive material 50 can carry signals between row drivers to be mounted in the interconnect region and the row electrodes.

Figure 9E:
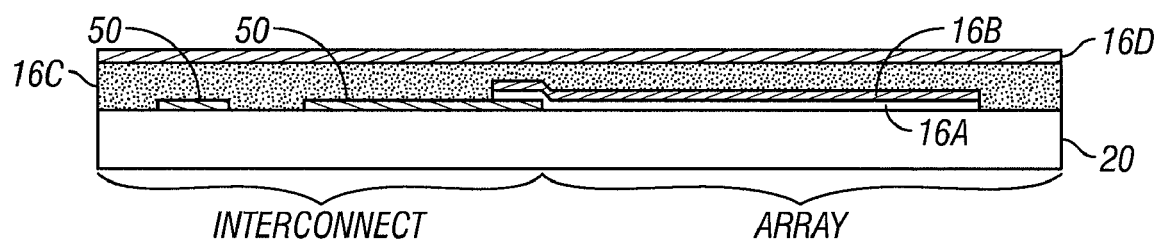

As shown in FIG. 9E, the transparent dielectric layer 16C (e.g., silicon dioxide ($SiO_2$)) and optional aluminum oxide ($Al_2O_3$) cap layer 16D of the optical stack 16 are then deposited over the structure to provide electrical isolation during operation between the stationary row electrodes and subsequently formed moving column electrodes. The dielectric layer 16C can be deposited before or after patterning the row electrodes. It will be appreciated that, in some arrangements, a further etch stop layer (not shown) is formed over the cap layer 16D to protect it during subsequent patterning steps to define multiple thicknesses of sacrificial material to define multiple cavity sizes and corresponding colors.

Figure 9F:
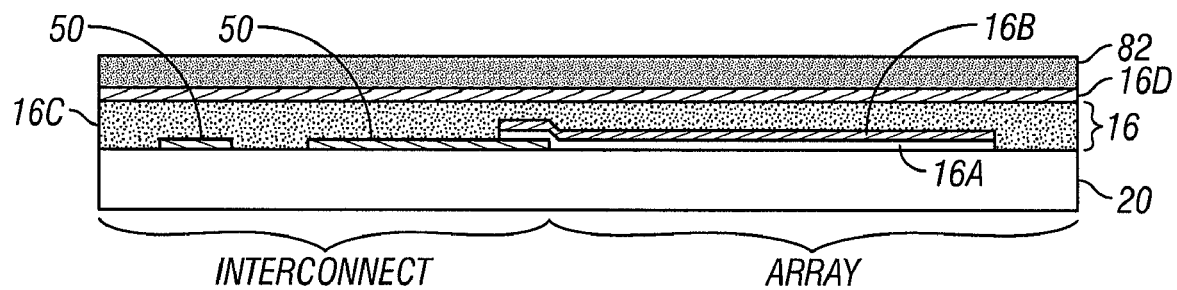

As shown in FIG. 9F, a sacrificial layer (or layers) 82, preferably comprising a material that can be selectively etched by fluorine-based etchants, and particularly molybdenum (Mo), is deposited (and later removed in the release etch) over the structure. It will be understood that, in alternative embodiments, the sacrificial layer 82 may be selectively deposited only in the image area. The sacrificial layer 82 preferably comprises a material that is selectively etchable, relative to the upper layer(s) of the optical stack 16 and other adjacent materials of the MEMS device. In certain embodiments, this sacrificial layer 82 may comprise, for example, tungsten (W), titanium (Ti), or amorphous silicon.

Figure 9G:
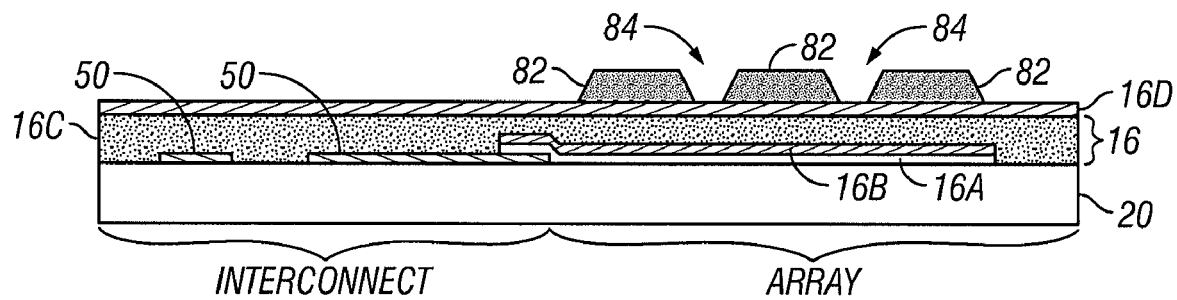

As illustrated in FIG. 9G, according to this embodiment, the sacrificial layer 82 is patterned such that it remains only in the image (or "array" or "display") area. It will be understood that the sacrificial layer 82 may be selectively deposited or etched in different locations to define cavities of different heights. For example, the sacrificial layer may comprise multiple layers that are deposited and subsequently patterned to have multiple thicknesses to produce interferometric modulators for reflecting multiple different colors, such as red, green, and blue for an RGB display system. The skilled artisan will appreciate that the sacrificial material 82 is patterned and etched in order to form vias 84 for support structures (the deposition of which will be described below) in the display or image area of the device, as shown in FIG. 9G. Preferably, a dry etch is performed to pattern the sacrificial layer 82.

Figure 9H:
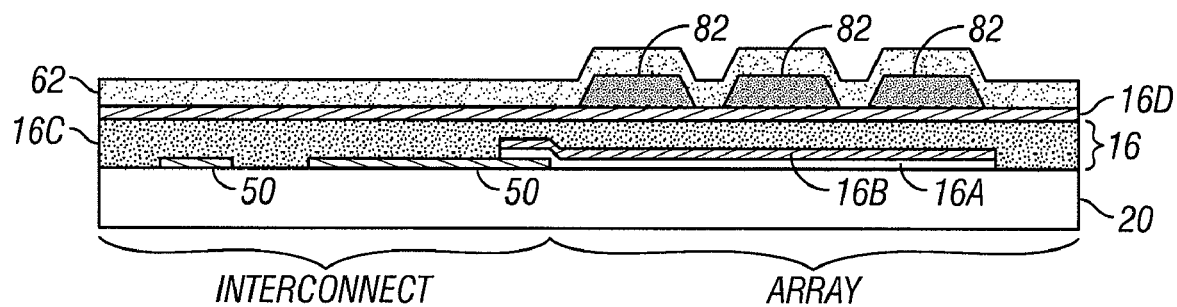

After patterning and etching the sacrificial material 82, a support layer 62, preferably formed of an insulating material such as silicon dioxide ($SiO_2$), is deposited over the entire structure, as shown in FIG. 9H. The support layer 62 preferably comprises an inorganic material (e.g., oxide, particularly $SiO_2$).

Figure 9I:
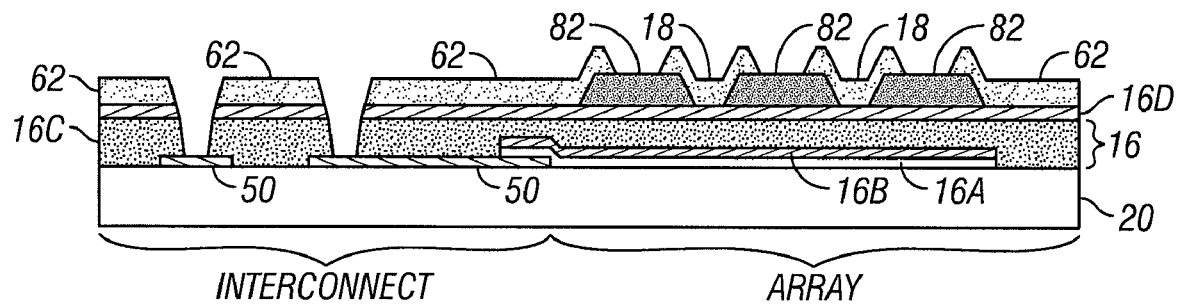

As illustrated in FIG. 9I, this support layer 62 is then patterned to form support structures 18 for the device in the image or display area. In the interconnect region, the support layer 62, together with the dielectric layers of the optical stack 16, serves as an insulator for electrically separating and passivating interconnect structures. The support layer 62 is patterned to form contact openings to the conductive material 50, as shown in on the left side of FIG. 9I. As shown in FIG. 9I, portions of the $Al_2O_3$ cap layer 16D and the dielectric layer 16C of the optical stack 16 are also etched to form the contact openings to the routing/interconnect 50. The skilled artisan will appreciate that these contacts may be formed either prior to or after a release etch, which will be described below.

Figure 9J:
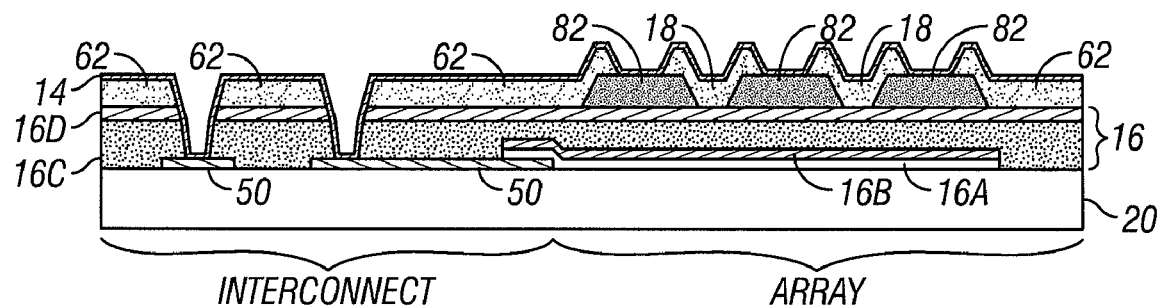

As shown in FIG. 9J, the movable layer 14 is deposited over the entire structure to form the movable electrodes of the interferometric modulator in the array region. As noted above, the illustrated movable layer 14 is formed of nickel over aluminum. In other embodiments, the movable layer can be a reflector suspended from a separately patterned deformable layer.

Figure 9K:
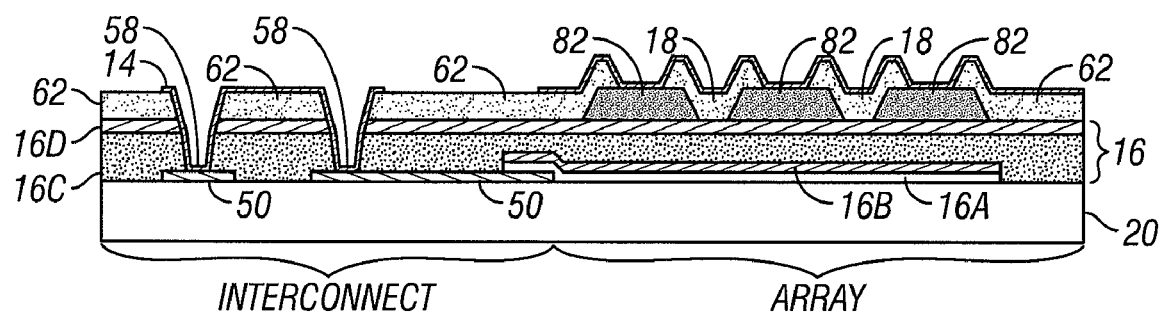

In the array region, the movable layer 14 is deposited and patterned into column electrodes that cross over, e.g., are orthogonal to, the row electrodes of the optical stack 16 to create the row/column array described above. The movable layer 14 is patterned and etched, preferably first etching the nickel layer using $HNO_3$:DI followed by etching of the aluminum reflective layer using $H_3PO_4$ or TMAH, as shown in FIG. 9K. The skilled artisan will appreciate that holes (not shown) are preferably etched in portions of the movable layer 14 that are over areas of the sacrificial layer 82 to be removed by the release etch (in the image or display area). It will be understood that the movable layer 14 is used to form contact pads 58 to the conductive material 50 in the interconnect region. In this embodiment, the movable layer 14 directly contacts the conductive material 50 and is therefore electrically connected to the conductive material 50. the conductive material 50 forms a layer of the routing providing electrical contact between the lower electrodes (transparent conductor 16A and optional absorber layer 16B) and contact pads 58 that serve to connect row drivers to be mounted.

Figure 9L:
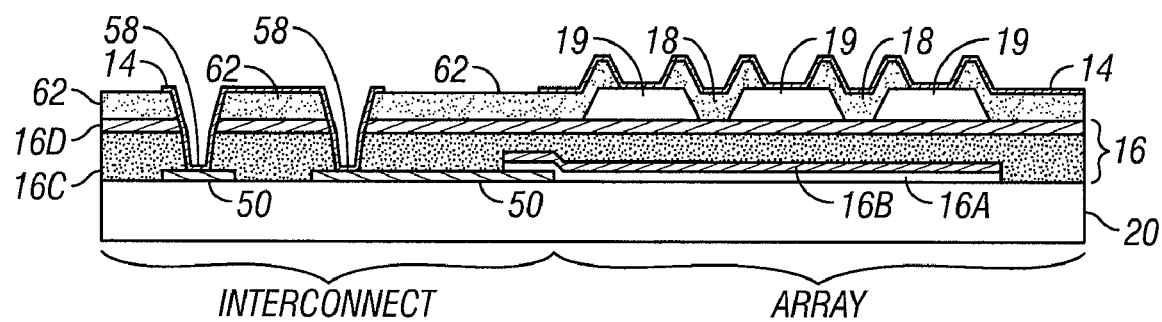

The exposed areas of the sacrificial layer 82 are removed in a release etch, after the movable layer 14 is formed, to create the optical cavities 19 between the fixed electrodes of the optical stack 16 and the upper electrodes of the movable layer 14 in the display or image area, as shown in FIG. 9L. Standard release techniques may be used to remove the sacrificial layer 82. The particular release technique will depend on the material to be removed. For example, a fluorine-based etchant, such as xenon difluoride ($XeF_2$), may be used to remove a molybdenum (illustrated), tungsten, or silicon sacrificial layer. The skilled artisan will appreciate that the release etchants are chosen to be selective such that the support structure material 62 and the movable layer 14 will not be removed by the release etch.

The conductive material 50 is provided as an electrical interconnect as well as serving as a barrier layer in the interconnect region between the movable layer 14 that forms upper electrodes in the array region and the layers of the optical stack 16 that form the lower electrodes in the array region. After the release etch, a backplate is preferably sealed to the transparent substrate 20 using a seal to protect the display area.

Figure 10A:
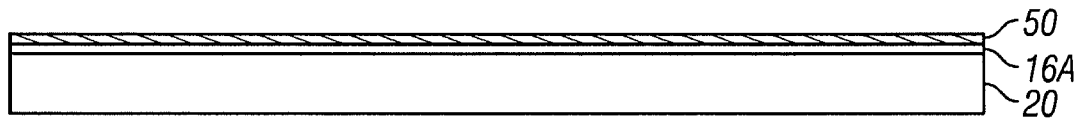
FIGS. 10A-10L are cross sections showing a process for making another embodiment of an interferometric modulator.

According to a third embodiment illustrated in FIGS. 10A-10L, the conductive material 50 forming a layer of the interconnect/routing may be deposited over the transparent conductor 16A (e.g., ITO) and before the partially reflective absorber layer 16B (e.g., MoCr or Cr) of the optical stack 16 is deposited. As shown in FIG. 10A, a layer of conductive material 50, preferably nickel, is deposited over the transparent conductor layer 16A, which is deposited over a transparent substrate 20. The skilled artisan will appreciate that, in other embodiments, the conductive material 50 may comprise other conductive materials, which are resistant to fluorine-based etchants (e.g., $XeF_2$) and provide good electrical contact between the reflective layer of the movable layer and the ITO of the optical stack 16, such as, for example, copper (Cu), chromium (Cr), silver (Ag), and their alloys.

Figure 10B:
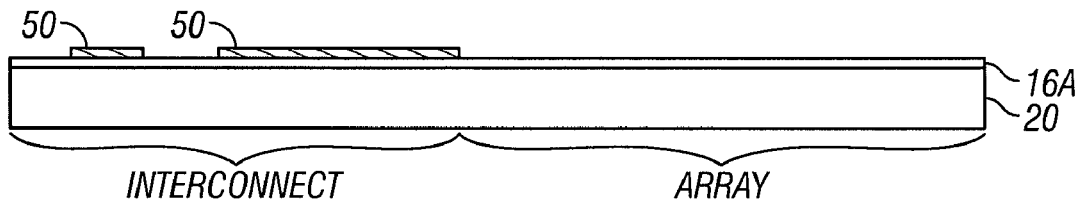
Figure 10C:
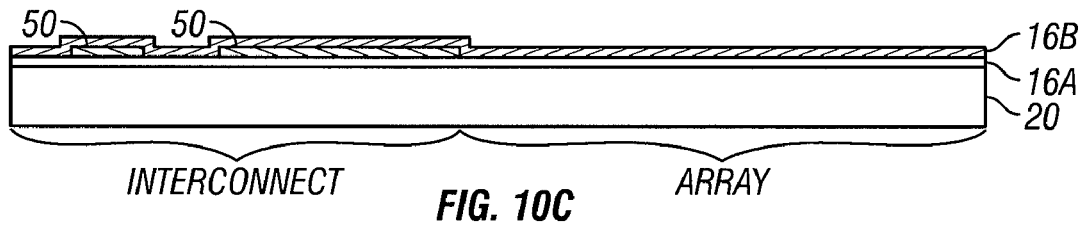

The layer of conductive material 50 is then etched and patterned selectively to the layer 16A, as shown in FIG. 10B, to form the peripheral interconnect/routing of the MEMS device. A conductive material 50 formed of nickel, for example, is preferably etched with a diluted $HNO_3$ solution (preferably <15%). An absorber layer 16B of MoCr or Cr of the optical stack 16 is preferably deposited over the entire structure, as shown in FIG. 10C.

Figure 10D:
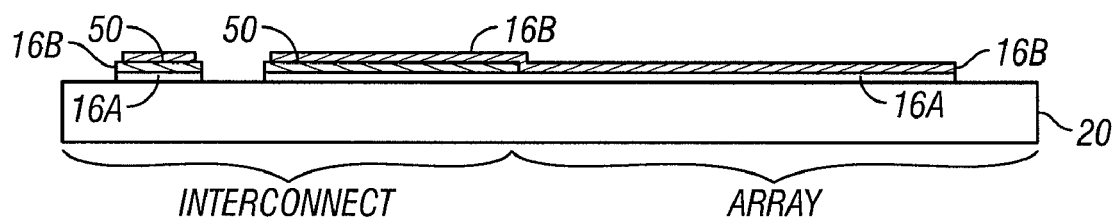

According to an embodiment, the absorber layer 16B is etched (dry or wet) first such that it remains over the patterned conductive material 50 and a portion over the transparent conductor 16A, as shown in FIG. 10D. A MoCr layer, for example, is preferably etched using a PAN etch. A Cr layer can be etched using a chrome etch, such as CR-14 (Ceric Ammonium Nitrate $Ce(NH_4)_2(NO_3)_6$ 22%, Acetic Acid 9%, Water 69%). After the absorber layer 16B is etched, the transparent conductor layer 16A is then etched and patterned into rows to form the electrodes of the optical stack 16 in the array or image region, as illustrated in FIG. 10D. According to this embodiment, after the absorber layer 16B is etched and patterned, the transparent conductor layer 16A is etched and patterned, preferably using an etchant, such as HCl, HBr, $HCl+HNO_3$, or $FeCl_3/HCl/Dl$. Although the transparent conductor layer 16A is etched after the absorber layer 16B in the illustrated embodiment, it will be understood that they may be simultaneously etched and patterned to form the lower electrodes of the device.

Figure 10E:
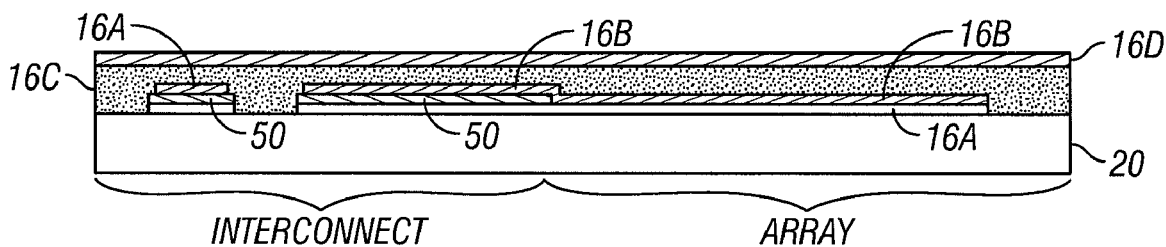

As shown in FIG. 10E, the transparent dielectric layer 16C (e.g., silicon dioxide ($SiO_2$)) and optional aluminum oxide ($Al_2O_3$) cap layer 16D are then deposited over the structure to provide electrical isolation during operation between the row electrodes and subsequently deposited column electrodes. The dielectric layer 16C can be deposited before or after patterning the row electrodes. It will be appreciated that, in some arrangements, a further etch stop layer is formed over the cap layer 16D to protect it during subsequent patterning steps to define multiple thicknesses of sacrificial material to define multiple cavity sizes and corresponding colors.

Figure 10F:
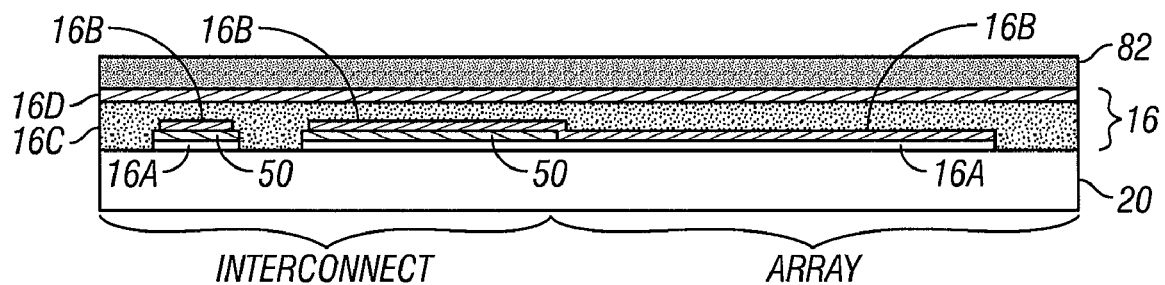

As shown in FIG. 10F, a sacrificial layer (or layers) 82, preferably comprising a material that can be selectively etched by fluorine-based etchants, and particularly molybdenum (Mo), is deposited (and later removed in the release etch) over the structure. It will be understood that, in alternative embodiments, the sacrificial layer 82 may be selectively deposited only in the image area. The sacrificial layer 82 preferably comprises material(s) selectively etchable relative to the upper layer(s) of the optical stack 16 and other adjacent materials of the MEMS device. In certain embodiments, this sacrificial layer 82 may comprise, for example, tungsten (W), titanium (Ti), or amorphous silicon.

Figure 10G:
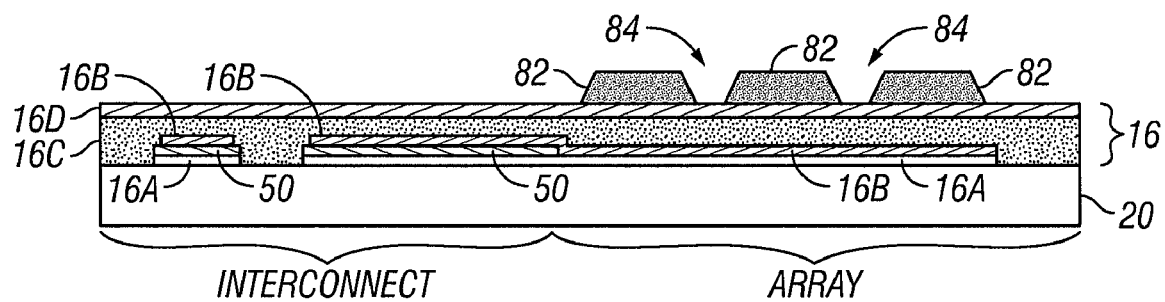

As illustrated in FIG. 10G, according to this embodiment, the sacrificial layer 82 is patterned such that it remains only in the image (or "array" or "display") area. It will be understood that the sacrificial layer 82 may be selectively deposited or etched in different locations to produce cavities of different heights. For example, the sacrificial layer may comprise multiple layers that are deposited and subsequently patterned to form a sacrificial layer 82 having multiple thicknesses to produce interferometric modulators for reflecting multiple different colors, such as red, green, and blue for an RGB display system. The skilled artisan will appreciate that the sacrificial material 82 is also patterned and etched in order to form vias 84 for support structures (the deposition of which will be described below) in the display or image area of the device, as shown in FIG. 10G. Preferably, a dry etch is performed to pattern the sacrificial layer 82.

Figure 10H:
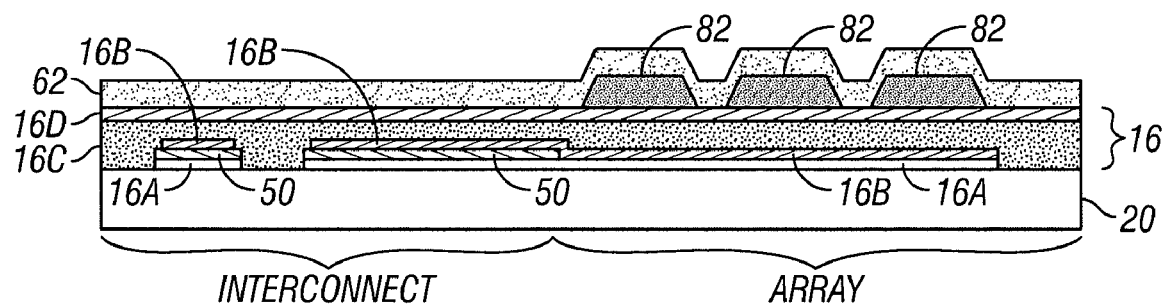

After patterning and etching the sacrificial material 82, a support layer 62, preferably formed of an insulating material, is deposited over the entire structure, as shown in FIG. 10H. The support layer 62 preferably comprises an inorganic material (e.g., oxide, particularly $SiO_2$).

Figure 10I:
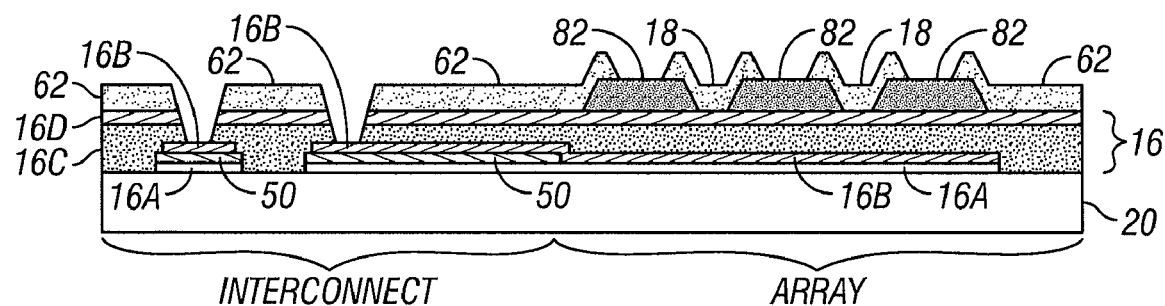

As illustrated in FIG. 10I, this support layer 62 is then patterned to form support structures 18 for the device in the image or display area. In the interconnect region, the support layer 62, together with the dielectric layers of the optical stack 16, serves as an insulator for electrically separating and passivating interconnect structures. The support layer 62 is patterned to form contact openings to the conductive material 50, as shown in on the left side of FIG. 10I. As shown in FIG. 10I, portions of the cap layer 16D and the dielectric layer 16C are also etched to form the contact openings to the absorber layer 16B and conductive material 50. The skilled artisan will appreciate that these contacts may be formed either prior to or after a release etch, which will be described below.

Figure 10J:
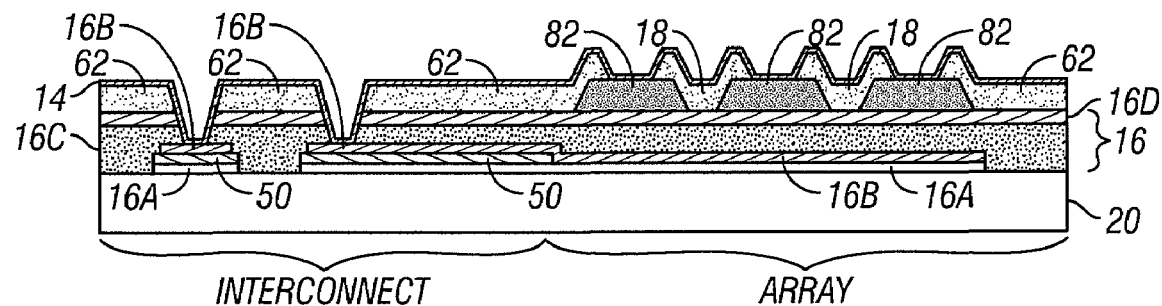

As shown in FIG. 10J, the movable layer 14 is deposited over the entire structure to form the movable electrodes 14 of the interferometric modulator in the array region. As noted above, the illustrated movable layer 14 is formed of nickel over aluminum. In other embodiments, the movable layer can be a reflector suspended from a separately patterned deformable layer.

Figure 10K:
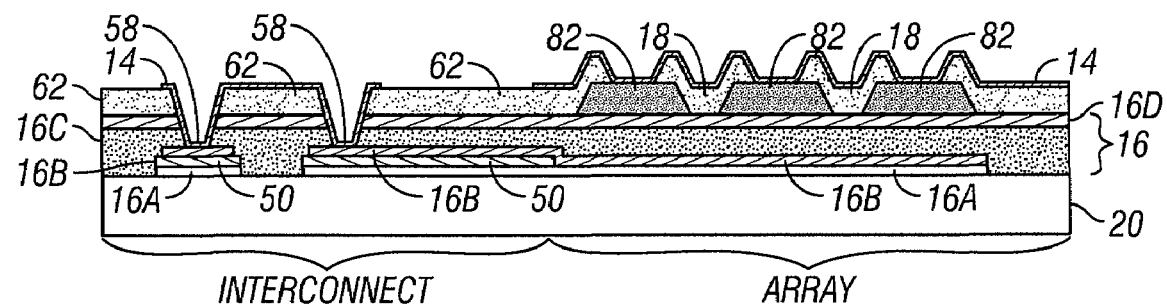
Figure 10L:
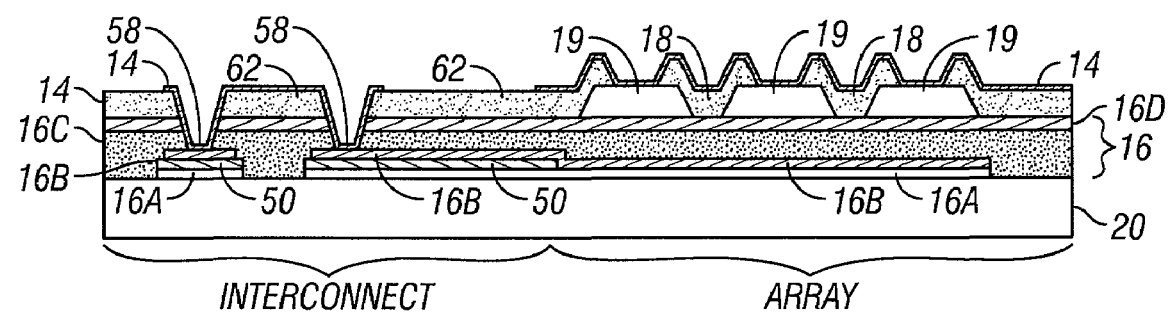

In the array region, the movable layer 14 is deposited and patterned into column electrodes that cross over, e.g., are orthogonal to, the row electrodes of the optical stack 16 to create the row/column array described above. The movable layer 14 is patterned and etched, preferably first etching the nickel layer using $HNO_3$:DI followed by etching of the aluminum reflective layer using $H_3PO_4$ or TMAH, as shown in FIG. 10K. The skilled artisan will appreciate that holes (not shown) are preferably etched in portions of the movable layer 14 that are over areas of the sacrificial layer 82 to be removed by the release etch (in the image or display area). It will be understood that the movable layer 14 is used to form contact pads 58 to the conductive material 50 in the interconnect region. The conductive material 50 is thus electrically connected (through the absorber layer 16B) to the movable layer 14. The conductive material 50 forms a layer of the routing providing electrical contact between the lower electrodes (transparent conductor 16A and optional absorber layer 16B) and contact pads 58 that serve to connect row drivers to be mounted.

The exposed areas of the sacrificial layer 82 are removed in a release etch, after the movable layer 14 is formed, to create the optical cavities 19 between the fixed electrodes of the optical stack 16 and the upper electrodes formed by the movable layer 14 in the display or image area, as shown in FIG. 9L. Standard release techniques may be used to remove the sacrificial layer 82. The particular release technique will depend on the material to be removed. For example, a fluorine-based etchant, such as xenon difluoride ($XeF_2$), may be used to remove a molybdenum (illustrated), tungsten, or silicon sacrificial layer. The skilled artisan will appreciate that the release etchants are chosen to be selective such that the support structure material 62 and the movable layer 14 will not be removed by the release etch. After the release etch, a backplate is preferably sealed to the transparent substrate 20 using a seal to protect the display area.

Although the embodiments described above are illustrated with respect to routing for lower electrodes of the device, it will be understood that similar embodiments may be made by those skilled in the art with routing for upper electrodes, either simultaneously with or instead of routing for lower electrodes.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A peripheral routing region of a microelectromechanical systems device, comprising:
   an electrical interconnect comprising a conductive layer comprising a material selected from the group consisting of nickel, copper, chromium, and silver;
   a partially reflective layer; and
   a transparent conductor, wherein at least a portion of the conductive layer is directly under, directly over, or between the partially reflective layer and the transparent conductor.

2. The peripheral routing region of claim 1, wherein the transparent conductor is a layer of a lower electrode of the microelectromechanical systems device.

3. The peripheral routing region of claim 2, wherein the electrical interconnect is configured to be electrically connected to at least one of the lower electrode and a movable conductive layer of the microelectromechanical systems device.

4. The peripheral routing region of claim 2, wherein the transparent conductor comprises indium tin oxide under the conductive layer.

5. The peripheral routing region of claim 1, wherein the partially reflective layer comprises chromium.

6. The peripheral routing region of claim 1, wherein the conductive layer is between the transparent conductor and the partially reflective layer.

7. The peripheral routing region of claim 1, wherein the partially reflective layer is over and contacting the conductive layer.

8. The peripheral routing region of claim 1, wherein the conductive layer comprises nickel.

9. The peripheral routing region of claim 8, further comprising a second nickel layer over the conductive layer.

10. The peripheral routing region of claim 9, further comprising a reflective layer under the second layer and contacting the electrical interconnect.

11. The peripheral routing region of claim 10, wherein the reflective layer comprises aluminum.

12. A microelectromechanical systems device, comprising:
 an array comprising a lower electrode, a movable upper electrode, and a cavity between the lower electrode and the upper electrode; and
 a peripheral region comprising:
  a portion of a layer forming the upper electrode in the array; and
  a conductive material of an electrical interconnect electrically connected to at least one of the lower electrode and the upper electrode, wherein the conductive material is formed of a layer separate from and below the layer forming the upper electrode in the array, the conductive material comprising a material selected from the group consisting of nickel, chromium, copper, and silver.

13. The microelectromechanical systems device of claim 12, wherein the lower electrode comprises a transparent conductive layer.

14. The microelectromechanical systems device of claim 13, wherein the lower electrode further comprises a partially reflective layer and at least a portion of the conductive material in the peripheral region is directly over the transparent conductive layer and the partially reflective layer.

15. The microelectromechanical systems device of claim 13, wherein the lower electrode further comprises a partially reflective layer and at least a portion of the conductive material in the peripheral region is directly under the transparent conductive layer and the partially reflective layer.

16. The microelectromechanical systems device of claim 13, wherein the lower electrode further comprises a partially reflective layer and at least a portion of the conductive material in the peripheral region is between the transparent conductive layer and the partially reflective layer.

17. The microelectromechanical systems device of claim 13, wherein the upper electrode further comprises a nickel layer over an aluminum layer.

18. The microelectromechanical systems device of claim 12, wherein the upper electrode comprises an aluminum layer.

19. The microelectromechanical systems device of claim 12, wherein the device is an interferometric modulator.

20. The microelectromechanical systems device of claim 12, further comprising:
 a display;
 a processor that is in electrical communication with said display, said processor being configured to process image data;
 a memory device in electrical communication with said processor.

21. The microelectromechanical systems device of claim 20, further comprising:
 a driver circuit configured to send at least one signal to said display.

22. The microelectromechanical systems device of claim 21, further comprising:
 a controller configured to send at least a portion of said image data to said driver circuit.

23. The microelectromechanical systems device of claim 20, further comprising:
 an image source module configured to send said image data to said processor.

24. The microelectromechanical systems device of claim 23, wherein said image source module comprises at least one of a receiver, transceiver, and transmitter.

25. The microelectromechanical systems device of claim 20, further comprising:
 an input device configured to receive input data and to communicate said input data to said processor.

26. A method of making a microelectromechanical systems device, comprising:
 depositing a first electrode layer over a transparent substrate;
 patterning the first electrode layer to form lower electrodes in an array region;
 depositing a conductive layer over the transparent substrate, wherein the conductive layer comprises a material selected from the group consisting of nickel, copper, chromium, and silver;
 patterning the conductive layer to form a pattern for an electrical interconnect in a peripheral region;
 depositing a sacrificial layer over the lower electrodes in the array region;
 after patterning the conductive layer, depositing a second electrode layer over the sacrificial layer to form upper electrodes in the array region.

27. The method of claim 26, wherein the first electrode layer is patterned before patterning the conductive layer.

28. The method of claim 26, wherein the conductive layer is patterned before patterning the first electrode layer.

29. The method of claim 26, further comprising a nickel layer over the upper electrodes.

30. The method of claim 26 layer, wherein the electrical interconnect contacts the upper electrodes to form a contact pad in the peripheral region.

31. The method of claim 30, wherein the upper electrodes comprise aluminum and the conductive layer comprises nickel.

32. The method of claim 30, further comprising mounting a driver connected to the contact pad.

33. The method of claim 26, further comprising depositing a dielectric layer over the conductive layer and the lower electrodes after patterning the conductive layer.

34. The method of claim 26, wherein the lower electrodes are formed over the conductive layer.

35. The method of claim 26, wherein the conductive layer is formed over the lower electrodes.

36. The method of claim 26, further comprising depositing a dielectric layer over the conductive layer, wherein the conductive layer is formed over the lower electrodes.

37. The method of claim 26, wherein the device is an interferometric modulator.

38. The method of claim 26, further comprising removing the sacrificial layer after patterning the upper electrodes.

* * * * *

UNITED STATES PATENT AND TRADEMARK OFFICE
CERTIFICATE OF CORRECTION

PATENT NO. : 7,570,415 B2
APPLICATION NO. : 11/835308
DATED : August 4, 2009
INVENTOR(S) : Teruo Sasagawa Page 1 of 1

It is certified that error appears in the above-identified patent and that said Letters Patent is hereby corrected as shown below:

On the Title Page at Item (56), Page 3, Column 2, Line 54, under Other Publications, change "inteferometric" to --interferometric--.

On the Title Page at Item (56), Page 3, Column 2, Line 55, under Other Publications, change "capacitiive" to --capacitive--.

On the Title Page at Item (56), Page 4, Column 1, Line 8, under Other Publications, change "compatable" to --compatible--.

At Column 15, Line 65, change "50. the" to --50. The--.

At Column 20, Line 41, in Claim 30, after "claim 26" delete "layer".

Signed and Sealed this

Twenty-ninth Day of June, 2010

David J. Kappos
*Director of the United States Patent and Trademark Office*